United States Patent
Ge et al.

(10) Patent No.: US 11,676,750 B2
(45) Date of Patent: Jun. 13, 2023

(54) MAGNETIC LEVITATION

(71) Applicant: President and Fellows of Harvard College, Cambridge, MA (US)

(72) Inventors: Shencheng Ge, Boston, MA (US); George M. Whitesides, Newton, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 0 days.

(21) Appl. No.: 17/279,419

(22) PCT Filed: Sep. 26, 2019

(86) PCT No.: PCT/US2019/053094
§ 371 (c)(1),
(2) Date: Mar. 24, 2021

(87) PCT Pub. No.: WO2020/069081
PCT Pub. Date: Apr. 2, 2020

(65) Prior Publication Data
US 2022/0013268 A1    Jan. 13, 2022

Related U.S. Application Data

(60) Provisional application No. 62/800,796, filed on Feb. 4, 2019, provisional application No. 62/738,758, filed on Sep. 28, 2018.

(51) Int. Cl.
  *H01F 7/02* (2006.01)
  *G01N 9/00* (2006.01)
(52) U.S. Cl.
  CPC .............. *H01F 7/0236* (2013.01); *G01N 9/00* (2013.01)

(58) Field of Classification Search
  CPC .................................................... H01F 7/0236
  (Continued)

(56) References Cited

U.S. PATENT DOCUMENTS 4,427,960 A * 1/1984 Wuerfel ............... H01F 7/0252
                                                        335/306
8,264,309 B2    9/2012 LaFountain et al.
(Continued)

FOREIGN PATENT DOCUMENTS

CN    101882903 A    11/2010
CN    202649073 U *  1/2013
(Continued)

OTHER PUBLICATIONS

Mirica et al. "Measuring densities of solids and liquids using magnetic levitation: fundamentals." Journal of the American Chemical Society 131.29 (2009): 10049-10058. (Year: 2009).*
(Continued)

*Primary Examiner* — Walter L Lindsay, Jr.
*Assistant Examiner* — Philip T Fadul
(74) *Attorney, Agent, or Firm* — Wilmer Cutler Pickering Hale and Dorr LLP

(57) ABSTRACT

A magnetic levitation system is described, including a first cylinder-shaped magnet; a second cylinder-shaped magnet coaxially aligned with the first cylinder-shaped magnet; and a first cavity coaxially aligned with the first cylinder-shaped magnet; wherein the surfaces of the like-poles of the first and second cylinder-shaped magnets are parallel to each other and face each other to result in a linear magnetic field between the first and the second magnets. Methods of using a magnetic levitation system for analyzing a diamagnetic or paramagnetic sample are also described.

52 Claims, 19 Drawing Sheets

(58) Field of Classification Search
USPC .......................................................... 73/32 r
See application file for complete search history.

(56) References Cited

U.S. PATENT DOCUMENTS

| | | | |
|---|---|---|---|
| 8,833,732 B2 | 9/2014 | Heiko et al. | |
| 2009/0065438 A1 | 3/2009 | Chau | |
| 2009/0160279 A1 | 6/2009 | Baur | |
| 2011/0223612 A1* | 9/2011 | Wang | G01N 27/745 |
| | | | 435/7.1 |
| 2013/0313483 A1* | 11/2013 | Mace | G01N 33/57492 |
| | | | 73/32 R |
| 2013/0314080 A1 | 11/2013 | Whitesides et al. | |
| 2014/0099253 A1* | 4/2014 | Kulish | F02M 27/045 |
| | | | 210/222 |
| 2015/0135829 A1 | 5/2015 | Whitesides et al. | |
| 2016/0370386 A1 | 12/2016 | Demirci et al. | |

FOREIGN PATENT DOCUMENTS

| | | |
|---|---|---|
| CN | 105548343 A | 5/2016 |
| CN | 107677567 A | 2/2018 |
| CN | 108350939 A | 7/2018 |
| WO | WO-2017/039540 A1 | 3/2017 |

OTHER PUBLICATIONS

Fang et al. Machine translation of CN202649073U. Published Jan. 2013. Accessed Jan. 2023. (Year: 2013).*
Andersen et al., "Detection of membrane-bound and soluble antigens by magnetic levitation," Lab on a Chip, Sep. 5, 2017, vol. 17, pp. 3462-3473.
Atkinson et al., "Using Magnetic Levitation to Separate Mixtures of Crystal Polymorphs," Angew. Chem. Int. Ed., published online Aug. 12, 2013, vol. 52, pp. 10208-10211.
Bloxham et al., "Fractionating Polymer Microspheres as Highly Accurate Density Standards," Anal. Chem., Jul. 21, 2015, vol. 87, pp. 7485-7491.
Bwambok et al., "Paramagnetic Ionic Liquids for Measurements of Density Using Magnetic Levitation,". Anal. Chem., Aug. 23, 2013, vol. 85, 8442-8447.
Castro et al., "Portable and Power-free Serodiagnosis of Chagas Disease using Magnetic Levitating Microbeads," Analyst, Jul. 2018, vol. 143(18), pp. 4379-4386. 19 pages.
Cugat et al., "Magnetic Micro-Actuators and Systems (MAG-MAS)," IEEE Transactions on Magnetics, Nov. 2003, vol. 39(5), pp. 3607-3612.
Durmus et al., "Magnetic levitation of single cells," Proc. Natl. Acad. Sci., published online Jun. 29, 2015, vol. 112, pp. E3661-E3668.
Enomoto et al., "Synthesis of Cold Antihydrogen in a Cusp Trap," Physical Review Letters, Dec. 10, 2010, PRL 105, 243401, pp. 1-4.
Ge et al., "'Axial' Magnetic Levitation Using Ring Magnets Enables Simple Density-Based Analysis, Separation, and Manipulation," Analytical Chemistry, Oct. 1, 2018, vol. 90(20), pp. 12239-12245 (7 pages).
Ge et al., "High-Throughput Density Measurement Using Magnetic Levitation," J. Am. Chem. Soc., Jun. 11, 2018, vol. 140, pp. 7510-7518.
Ge et al., "Magnetic Levitation To Characterize the Kinetics of Free-Radical Polymerization," J. Am. Chem. Soc., Dec. 6, 2017, vol. 139, pp. 18688-18697.
Grzybowski, B. A., "Static and Dynamic Self-Organization," PhD Thesis, Harvard University, Aug. 2000. 352 pages.
Hennek et al., "Using Magnetic Levitation for Non-Destructive Quality Control of Plastic Parts," Adv. Mater., Jan. 14, 2015, vol. 27(9), pp. 1587-1592.
International Search Report and Written Opinion dated Mar. 10, 2020, in the International Application No. PCT/US19/53094. 9 pages.

Kirchnerová et al., "The solubility of water in low-dielectric solvents," Can. J. Chem., Dec. 1976, vol. 54, pp. 3909-3916.
Lee et al., "Solvent Compatibility of Poly(dimethylsiloxane)-Based Microfluidic Devices," Analytical Chemistry, Dec. 1, 2003, vol. 75(23), pp. 6544-6554.
Maleki et al., "Shrinking of Chemically Cross-Linked Polymer Networks in the Postgel Region," Polymer Bulletin, Feb. 2007, vol. 58, pp. 435-445.
Migdall et al., "First Observation of Magnetically Trapped Neutral Atoms," Phys. Rev. Lett., Jun. 17, 1985, vol. 54(24), pp. 2596-2599.
Mirica et al., "Magnetic Levitation in the Analysis of Foods and Water," J. Agric. Food. Chem., Jun. 9, 2010, vol. 58(11), pp. 6565-6569.
Mirica et al., "Measuring Densities of Solids and Liquids Using Magnetic Levitation: Fundamentals," J. Am. Chem. Soc., published online Jul. 2, 2009, vol. 131, pp. 10049-10058.
Mirica et al., "Using Magnetic Levitation for Three Dimensional Self-Assembly," Adv. Mater., published online Aug. 10, 2011, vol. 23, pp. 4134-4140.
Nemiroski et al. "High-Sensitivity Measurement of Density by Magnetic Levitation,". Anal. Chem., Jan. 27, 2016, vol. 88, pp. 2666-2674.
Nemiroski et al., "Tilted Magnetic Levitation Enables Measurement of the Complete Range of Densities of Materials with Low Magnetic Permeability," J. Am. Chem. Soc., Jan. 2016, vol. 138, pp. 1252-1257.
Ono et al., "Lipophilic polyelectrolyte gels as super-absorbent polymers for nonpolar organic solvents," Nature Materials, Jun. 2007, vol. 6, pp. 429-433.
Parfenov et al., "Scaffold-free, label-free and nozzle-free biofabrication technology using magnetic levitational assembly," Author Manuscript, Biofabrication, Jun. 2018, vol. 10(3):034104. 30 pages.
Pulko et al., "Magnetic separation of Dy(III) ions from homogeneous aqueous solutions," Appl. Phys. Lett., published online Dec. 11, 2014, vol. 105:232407.
Santini et al., "A Measure of Solvent Effects on Swelling of Resins for Solid Phase Organic Synthesis," Tetrahedron Letters, Dec. 3, 1998, vol. 39, pp. 8951-8954.
Shapiro et al., "Magnetic Levitation as a Platform for Competitive Protein-Ligand Binding Assays," Author Manuscript, Anal. Chem., Jul. 17, 2012, vol. 84(14), pp. 6166-6172. 16 pages.
Shapiro et al., "Measuring Binding of Protein to Gel-Bound Ligands Using Magnetic Levitation," J. Am. Chem. Soc., Feb. 24, 2012, vol. 134, pp. 5637-5646.
Subramaniam et al., "Metal-Amplified Density Assays, (MADAs), including a Density-Linked Immunosorbent Assay (DeLISA)," Lab on a Chip (2015), Dec. 4, 2014, vol. 15, pp. 1009-1022.
Subramaniam et al., "Noncontact orientation of objects in three-dimensional space using magnetic levitation," Proc. Natl. Acad. Sci., Sep. 9, 2014, vol. 111(36), pp. 12980-12985.
Tasoglu et al., "Levitational image cytometry with temporal resolution," Author Manuscript, Adv. Mater., Jul. 8, 2015, vol. 27, pp. 3901-3908. 12 pages.
Timonen et al., "Magnetofluidic Tweezing of Nonmagnetic Colloids," Adv. Mater., published online Mar. 16, 2016, vol. 28, pp. 3453-3459.
Timonen et al., "Tweezing of Magnetic and Non-Magnetic Objects with Magnetic Fields," Adv. Mater., published online Feb. 15, 2017, vol. 29:1603516, 17 pages.
Winkleman et al., "Density-Based Diamagnetic Separation: Devices for Detecting Binding Events and for Collecting Unlabeled Diamagnetic Particles in Paramagnetic Solutions," Anal. Chem., Sep. 1, 2007, vol. 79, pp. 6542-6550.
Xia et al., "Density measurement for polymers by magneto-Archimedes levitation: Simulation and experiments," Polymer Testing, published online Sep. 11, 2017, vol. 63, pp. 455-461.
Xia et al., "Non-destructive measurement of three-dimensional polymeric parts by magneto-Archimedes levitation," Polymer Testing, published online Jan. 8, 2018, vol. 66, pp. 32-40.
Zhang et al., "Single-Ring Magnetic Levitation Configuration for Object Manipulation and Density-Based Measurement," Analytical Chemistry, Jun. 27, 2018, vol. 90, pp. 9226-9233.

(56) References Cited

OTHER PUBLICATIONS

Extended European Search Report dated Jun. 1, 2022, in the European patent application No. 19864487.4. 9 pages.
Written Opinion dated Aug. 30, 2022, in Singapore patent application No. 11202102967P. 5 pages.

* cited by examiner

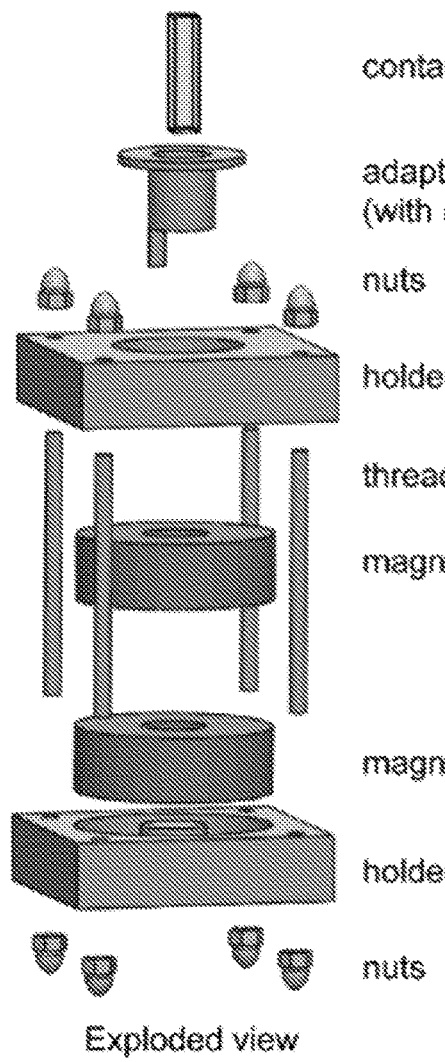
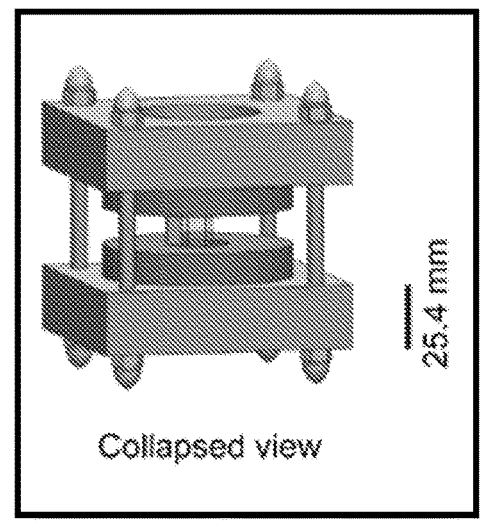
FIG. 7B
FIG. 7A

MAGNETIC LEVITATION

CROSS-REFERENCE TO RELATED APPLICATIONS

This application is a National Stage Entry of PCT International Application No. PCT/US2019/053094, filed on Sep. 26, 2019, which claims priority to U.S. Provisional Patent Application No. 62/738,758, filed on Sep. 28, 2018, and U.S. Provisional Patent Application No. 62/800,796, filed Feb. 4, 2019, the contents of each of which are hereby incorporated by reference in their entireties.

INCORPORATION BY REFERENCE

All patents, patent applications and publications cited herein are hereby incorporated by reference in their entirety in order to more fully describe the state of the art as known to those skilled therein as of the date of the invention described herein.

STATEMENT REGARDING FEDERALLY SPONSORED RESEARCH OR DEVELOPMENT

This invention was made with government support under 1420570 awarded by the National Science Foundation and DE-SC0000989 awarded by the U.S. Department of Energy. The government has certain rights in the invention.

FIELD OF THE INVENTION

The instant application relates generally to magnetic levitation (MagLev) devices.

SUMMARY

In one aspect, a magnetic levitation system is described, including a first cylinder-shaped magnet; a second cylinder-shaped magnet coaxially aligned with the first cylinder-shaped magnet; and a first cavity coaxially aligned with and formed in the first cylinder-shaped magnet; wherein the surfaces of the like-poles of the first and second cylinder-shaped magnets are parallel to each other and face each other to result in a linear magnetic field between the first and the second magnets.

In any one or more of the embodiments disclosed herein, the first cavity is cylinder-shaped.

In any one or more of the embodiments disclosed herein, the first cavity spans through the entire height of the first cylinder-shaped magnet.

In any one or more of the embodiments disclosed herein, the linear magnetic field extends into the first cavity.

In any one or more of the embodiments disclosed herein, the first and second cylinder-shaped magnets have different radius or height.

In any one or more of the embodiments disclosed herein, the first and second cylinder-shaped magnets have the same radius, height or both.

In any one or more of the embodiments disclosed herein, the system further includes a second cavity formed in and coaxially aligned with the second cylinder-shaped magnet.

In any one or more of the embodiments disclosed herein, the second cavity is cylinder-shaped.

In any one or more of the embodiments disclosed herein, the distance between the surfaces of the like-poles of the first and second cylinder-shaped magnets is d and the heights of the first and second cylinder-shaped magnets are $h_1$ and $h_2$, respectively; and the ratio of at least one of $h_1$ and $h_2$ to d is from about 0.2:1 to about 10:1.

In any one or more of the embodiments disclosed herein, the ratio of at least one of $h_1$ and $h_2$ to d is about 1.67:1.

In any one or more of the embodiments disclosed herein, the first cylinder-shaped magnet's inner diameter is $id_1$; and the ratio of $id_1$ to d is from about 0.2:1 to about 10:1.

In any one or more of the embodiments disclosed herein, the ratio of $id_1$ to d is about 1.67:1.

In any one or more of the embodiments disclosed herein, the first cylinder-shaped magnet's outer diameter is $od_1$; and the ratio of $od_1$ to d is from about 0.3:1 to about 100:1.

In any one or more of the embodiments disclosed herein, the ratio of $od_1$ to d is about 5:1.

In any one or more of the embodiments disclosed herein, the system further includes a second cylinder-shaped cavity formed in and coaxially aligned with the second cylinder-shaped magnet; the second cylinder-shaped magnet's inner diameter is $id_2$; and the ratio of $id_2$ to d is from about 0.2:1 to about 10:1.

In any one or more of the embodiments disclosed herein, the ratio of $id_2$ to d is about 1.67:1.

In any one or more of the embodiments disclosed herein, the system further includes a second cavity formed in and coaxially aligned with the second cylinder-shaped magnet; the second cylinder-shaped magnet's outer diameter is ode; and the ratio of $od_2$ to d is from about 0.3:1 to about 100:1.

In any one or more of the embodiments disclosed herein, the ratio of $od_2$ to d is about 5:1.

In any one or more of the embodiments disclosed herein, the first cavity is cylinder-shaped and the ratio of the first cylinder-shaped magnet's inner diameter ($id_1$):outer diameter ($od_1$):height ($h_1$):distance between the surfaces of the like-poles of the first and second cylinder-shaped magnets (d) is about 1.67:5:1.67:1.

In any one or more of the embodiments disclosed herein, the system further includes a second cylinder-shaped cavity formed in and coaxially aligned with the second cylinder-shaped magnet; and the ratio of the second cylinder-shaped magnet's inner diameter ($id_2$):outer diameter ($od_2$):height ($h_2$):distance between the surfaces of the like-poles of the first and second cylinder-shaped magnets (d) is about 1.67:5:1.67:1.

In any one or more of the embodiments disclosed herein, the system further includes a container configured to hold a paramagnetic medium and at least partially disposed between the first and the second cylinder-shaped magnets.

In any one or more of the embodiments disclosed herein, the container further includes an inlet configured to allow adding or removing the paramagnetic medium or a paramagnetic or diamagnetic sample.

In any one or more of the embodiments disclosed herein, the container includes two ends, at least one of which extends into or through the first cavity.

In any one or more of the embodiments disclosed herein, the system further includes a second cavity formed in and coaxially aligned with the second cylinder-shaped magnet; and the other end of the container's two ends extends into or through the second cylinder-shaped cavity.

In any one or more of the embodiments disclosed herein, the container is a cuvette.

In any one or more of the embodiments disclosed herein, the paramagnetic medium includes an aqueous solution of a paramagnetic compound.

In any one or more of the embodiments disclosed herein, the paramagnetic compound is selected from the group consisting of $MnCl_2$, $MnBr_2$, $CuSO_4$, $GdCl_3$, $DyCl_3$, $HoCl_3$, a Gd chelated compound, and a combination thereof.

In any one or more of the embodiments disclosed herein, the Gd chelated compound is gadolinium (III) diethylenetriaminepentaacetic acid.

In any one or more of the embodiments disclosed herein, the paramagnetic medium includes a $MnCl_2$ aqueous solution.

In any one or more of the embodiments disclosed herein, the paramagnetic medium includes a hydrophobic paramagnetic medium or a paramagnetic ionic liquid.

In any one or more of the embodiments disclosed herein, the maximal magnetic field along the common axis of the first and second cylinder-shaped magnets is about 0.20-0.50 T.

In any one or more of the embodiments disclosed herein, the first and second cylinder-shaped magnets are NdFeB magnets.

In any one or more of the embodiments disclosed herein, the system optionally includes a second cylinder-shaped cavity spanning through the entire height of the second cylinder-shaped magnet and coaxially aligned with the second cylinder-shaped magnet; and the first or second cylinder-shaped magnet's inner diameter is from about 15 mm to about 40 mm.

In any one or more of the embodiments disclosed herein, the first or second cylinder-shaped magnet's inner diameter is about 25 mm.

In any one or more of the embodiments disclosed herein, the system optionally includes a second cylinder-shaped cavity spanning through the entire height of the second cylinder-shaped magnet and coaxially aligned with the second cylinder-shaped magnet; and the first or second cylinder-shaped magnet's outer diameter is from about 50 mm to about 100 mm.

In any one or more of the embodiments disclosed herein, the first or second cylinder-shaped magnet's outer diameter is about 76 mm.

In any one or more of the embodiments disclosed herein, the first or second cylinder-shaped magnet's height is from about 15 mm to about 50 mm.

In any one or more of the embodiments disclosed herein, the first or second cylinder-shaped magnet's height is about 25 mm.

In any one or more of the embodiments disclosed herein, the distance between the surfaces of the like-poles of the first and second cylinder-shaped magnets is from about 5 mm to about 50 mm.

In any one or more of the embodiments disclosed herein, the distance between the surfaces of the like-poles of the first and second cylinder-shaped magnets is about 15 mm.

In one aspect, a method of analyzing a diamagnetic or paramagnetic sample is described, including providing the system of any one of the preceding claims; disposing a container configured to hold a paramagnetic medium between the first and the second cylinder-shaped magnets; adding a paramagnetic medium and a diamagnetic or paramagnetic sample, either separately or together, into the container; and allowing the diamagnetic or paramagnetic sample levitate under the linear magnetic field between the first and second cylinder-shaped magnets.

In any one or more of the embodiments disclosed herein, the paramagnetic medium or the diamagnetic or paramagnetic sample is added through the first cylinder-shaped cavity.

In any one or more of the embodiments disclosed herein, the method further includes removing the paramagnetic medium or the diamagnetic or paramagnetic sample.

In any one or more of the embodiments disclosed herein, the paramagnetic medium or the diamagnetic or paramagnetic sample is removed through the first cylinder-shaped cavity.

In any one or more of the embodiments disclosed herein, the paramagnetic medium includes an aqueous solution of a paramagnetic compound, a hydrophobic paramagnetic medium, or a paramagnetic ionic liquid.

In any one or more of the embodiments disclosed herein, the paramagnetic compound is selected from the group consisting of $MnCl_2$, $MnBr_2$, $CuSO_4$, $GdCl_3$, $DyCl_3$, $HoCl_3$, a Gd chelated compound, and a combination thereof.

In any one or more of the embodiments disclosed herein, the Gd chelated compound is gadolinium (III) diethylenetriaminepentaacetic acid.

In any one or more of the embodiments disclosed herein, the paramagnetic medium includes a $MnCl_2$ aqueous solution.

In any one or more of the embodiments disclosed herein, the paramagnetic medium further includes cetyltrimethylammonium bromide.

In any one or more of the embodiments disclosed herein, the diamagnetic or paramagnetic sample includes a crosslinked polymer.

In any one or more of the embodiments disclosed herein, the method further includes determining the density of the crosslinked polymer.

In any one or more of the embodiments disclosed herein, the method further includes generating a standard curve correlating a sample's levitation height in the system with its density and determining the density of the crosslinked polymer using the standard curve and its levitation height in the system.

In any one or more of the embodiments disclosed herein, the crosslinked polymer includes polydimethylsiloxane.

Any aspect or embodiment disclosed herein may be combined with another aspect or embodiment disclosed herein. The combination of one or more embodiments described herein with other one or more embodiments described herein is expressly contemplated.

DESCRIPTION OF THE DRAWINGS

The application is described with reference to the following figures, which are presented for the purpose of illustration only and are not intended to be limiting. In the Drawings:

FIG. 7A shows the assembly of a MagLev device, according to one or more embodiments described herein.

FIG. 7B shows the collapsed view of the MagLev device of FIG. 7A, according to one or more embodiments described herein.

DETAILED DESCRIPTION

Figure 1A:
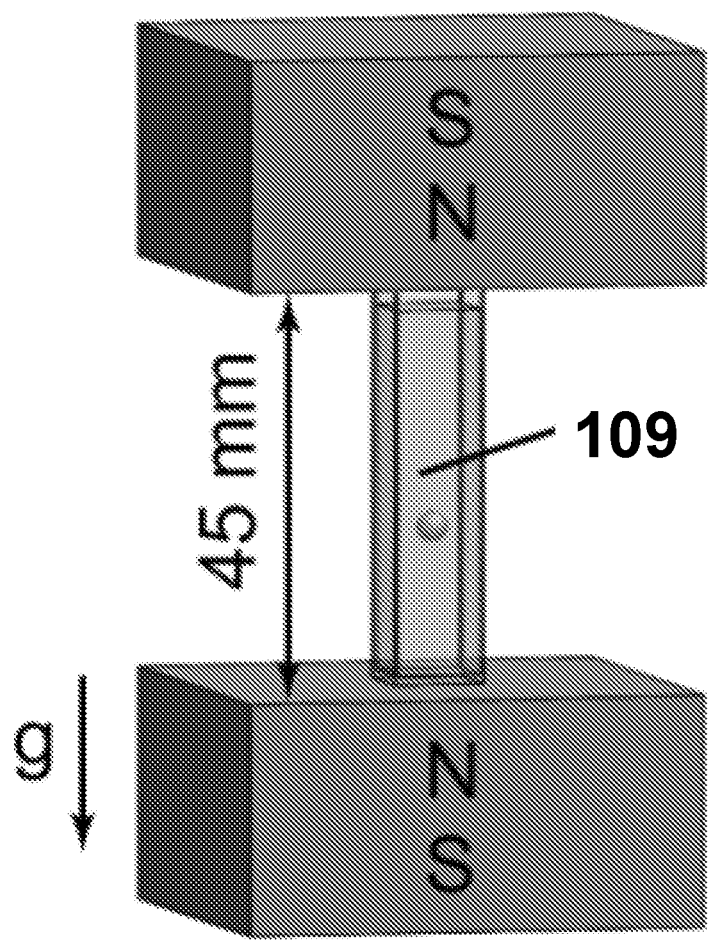
FIG. 1A shows a MagLev device including block magnets positioned coaxially, according to one or more embodiments described herein.

Magnetic levitation (MagLev) is a simple and useful technique to exploit density—a universal physical property of all matter—for a range of applications in diverse disciplines, e.g., chemistry, biochemistry, and materials science. The MagLev configuration shown in FIG. 1A has a spatial arrangement of magnets in which the sample container (e.g., a square cuvette with a height of, e.g., 45 mm) is sandwiched between two block NdFeB permanent magnets. This configuration does not allow the user (i) to easily add or remove the paramagnetic medium or the levitating samples (particularly viscous or sticky samples); (ii) to observe the levitating sample from the top or the bottom; (iii) to move the paramagnetic medium in the container along the central axis between the magnets; and (iv) to accommodate sample containers higher than the distance of separation between the magnets, such as, for example, tall vials and test tubes.

In some embodiments described herein are MagLev systems using cylinder-shaped magnets (e.g., ring magnets). These "axial" MagLev devices enable access to the sample along the central axis of the magnetic field, which is not possible using the block-type magnets of MagLev devices (e.g., the device of FIG. 1A). In some embodiments, axial MagLev enables simple procedures with which to perform density-based Magneto-Archimedean analyses, separations, and other manipulations. In some embodiments, density can be used to, for example, (i) separate or analyze different types of non-biological and biological materials (e.g., glass, metals, crystal polymorphs, polymer particles, mammalian cells, yeasts, and bacteria); (ii) monitor chemical processes that accompany changes in density (e.g., chemical reactions on a solid support and polymerization); monitor binding events (e.g., binding of ligands with enzymes, antibodies with antigens, and antibodies with cells); (iii) perform contact-free orientation of objects and self-assembly in three-dimensions; and (iv) perform quality-control of injection-molded plastic parts.

In one aspect, a magnetic levitation system is described, including:
a first cylinder-shaped magnet;
a second cylinder-shaped magnet coaxially aligned with the first cylinder-shaped magnet; and
a first cavity coaxially aligned with the first cylinder-shaped magnet;
wherein
the surfaces of the like-poles of the first and second cylinder-shaped magnets are parallel to each other and face each other to result in a linear magnetic field between the first and the second magnets.

In some embodiments, the first cavity is cylinder-shaped. In other embodiments, the cross section of the first cavity is in the shape of a triangle, a square or a hexagon, or any other symmetrical shape. In some embodiments, Applicants have surprisingly found that when a pair of cylinder-shaped magnets (e.g., ring magnets) with like-poles facing (analogous to the anti-Helmholtz configuration using electromagnets), a linear, axially-symmetric magnetic field is achieved, which can be used to levitate diamagnetic and weakly paramagnetic objects (i.e., objects with comparatively weaker paramagnetic properties and a comparatively lower value of magnetic susceptibility; e.g., aluminum) in a paramagnetic medium (e.g., aqueous solutions of $MnCl_2$ or $GdCl_3$) for density-based analyses, separations, and manipulations (see, e.g., FIG. 1B). In some embodiments, the use of a linear magnetic field between the ring magnets helps streamline the procedures to calibrate and carry out density measurements. In some embodiments, the nonlinear portion of the magnetic field, particularly the field in the cavity of the ring magnet, could also be used to perform density-based separations and manipulations.

In some embodiments, the axial MagLev system is described with reference to FIG. 1B. As shown in FIG. 1B, an axial MagLev system 100 is described, including a first cylinder-shaped magnet 101, a second cylinder-shaped magnet 103 coaxially aligned with the first cylinder-shaped magnet 101, and a first cylinder-shaped cavity 105 coaxially aligned with the first cylinder-shaped magnet 101, according to one or more embodiments. In some embodiments, the first cylinder-shaped cavity 105 spans through the entire height of the first cylinder-shaped magnet 101. In other embodiments, the first cylinder-shaped cavity 105 spans through a portion of the height of the first cylinder-shaped magnet 101. In some embodiments, the magnetic levitation system 100 includes a second cylinder-shaped cavity 111 coaxially aligned with the second cylinder-shaped magnet 103. In some embodiments, the second cylinder-shaped cavity 111 spans through the entire height of the second cylinder-shaped magnet 103. In other embodiments, the second cylinder-shaped cavity 111 spans through a portion of the height of the second cylinder-shaped magnet 103. In some embodiments, the first and second cylinder-shaped magnets 101 and 103 are NdFeB magnets. In some embodiments, the first and second cavities, 105 and 111, respectively, are cylinder-shaped. In other embodiments, the cross section of the first and/or second cavities are in the shape of a triangle, a square, a hexagon, or any other symmetrical shape.

Applicants have surprisingly found that the axial MagLev system according to one or more embodiments disclosed herein (comprising two like-pole-facing cylinder-shaped magnets) results in a linear magnetic field between the first and the second magnets. In some embodiments, the size of the magnets, aspect ratios of the magnets, and/or the distance between the two magnets are further optimized to yield a linear magnetic field. In some embodiments, the optimized, linear magnetic field generated between the two ring magnets (coaxially aligned and like-poles facing) enables the levitation of diamagnetic and weakly paramagnetic materials in a paramagnetic suspending medium, and makes density measurements more straightforward.

In some embodiments, a linear magnetic field exists at the space 107 between the first and the second magnets, 101 and 103, respectively. In some embodiments, the linear magnetic field extends into the first and/or second cylinder-shaped cavities, 105 and 111, respectively. In some specific embodiments, the linear magnetic field extends into at least about half the height of the first and/or second cylinder-shaped cavities, 105 and 111, respectively. According to one or more embodiments, the term "linear magnetic field" as used herein refers to the scenario where the vector of the magnetic field varies linearly along the central axis of the configuration so that the magnetic field has a linear gradient.

In some embodiments, the cylinder-shaped magnet is also referred to as a "ring magnet." In some embodiments, the first and second cylinder-shaped magnets have different radii and/or heights. In some embodiments, the first and second cylinder-shaped magnets have the same radius or the same height, or both.

In some embodiments, the axial MagLev system further includes a container (e.g., 109 in FIG. 1B) configured to hold a paramagnetic medium and at least partially disposed between the first and the second cylinder-shaped magnets. In some embodiments, the container 109 further includes an inlet 113 configured to allow adding or removing the paramagnetic medium or a paramagnetic or diamagnetic sample. As shown in FIG. 1B, the container 109 includes two ends (a top end and a bottom end), and in certain embodiments, at least one of the ends (e.g., the top end of container 109) extends into or through the first cylinder-shaped cavity 105. In some embodiments, the first cylinder-shaped cavity 105 allows the easy placement of the container 109 between the two facing magnets 101 and 103 and the easy removal of the container 109 from the axial MagLev system 100, both through the first cylinder-shaped cavity 105. In some embodiments, the other end of the container (e.g., the bottom end of container 109) extends into or through the second cylinder-shaped cavity 111 (not shown in FIG. 1B). Similarly, in some embodiments, the second cylinder-shaped cavity 111 allows the easy placement of the container 109 between the two facing magnets 101 and 103 and the easy removal of the container 109 from the axial MagLev system 100, both through the second cylinder-shaped cavity 111. Non-limiting examples of the container include a cuvette and a test tube.

In some embodiments, the size and/or aspect ratios of the first and/or second cylinder-shaped magnets are described, which result in a linear magnetic field between the two cylinder-shaped magnets. In some embodiments, the distance between the surfaces of the like-poles of the first and second cylinder-shaped magnets is d, the heights of the first and second cylinder-shaped magnets are $h_1$ and $h_2$, respectively, and the ratio of at least one of $h_1$ and $h_2$ to d is from about 0.2:1 to about 10:1. In some embodiments, the ratio of at least one of $h_1$ and $h_2$ to d is about 0.5:1, 0.8:1, 1:1, 1.5:1, 2:1, 3:1, 4:1, 5:1, 6:1, 7:1, 8:1, 9:1, or 10:1, or in a range bounded by any of the two values for the ratio disclosed herein.

Thus, in some embodiments, the ratio of $h_1$ to d or $h_2$ to d is from about 0.5:1 to about 10:1, from about 1:1 to about 10:1, from about 2:1 to about 10:1, from about 3:1 to about 10:1, from about 4:1 to about 10:1, from about 5:1 to about 10:1, from about 6:1 to about 10:1, from about 7:1 to about 10:1, from about 8:1 to about 10:1, or from about 9:1 to about 10:1. In some embodiments, the ratio of $h_1$ to d or $h_2$ to d is from about 0.5:1 to about 9:1, from about 1:1 to about 9:1, from about 2:1 to about 9:1, from about 3:1 to about 9:1, from about 4:1 to about 9:1, from about 5:1 to about 9:1, from about 6:1 to about 9:1, from about 7:1 to about 9:1, or from about 8:1 to about 9:1. In some embodiments, the ratio of $h_1$ to d or $h_2$ to d is from about 0.5:1 to about 8:1, from about 0.75:1 to about 8:1, from about 2:1 to about 8:1, from about 3:1 to about 8:1, from about 4:1 to about 8:1, from about 5:1 to about 8:1, from about 6:1 to about 8:1, or from about 7:1 to about 8:1.

In some embodiments, the ratio of $h_1$ to d or $h_2$ to d is from about 0.5:1 to about 4:1, from about 0.75:1 to about 3:1, from about 1:1 to about 2:1, from about 1.5:1 to about 2:1, or from about 1.6:1 to about 1.8.

In some embodiments, the ratio of at least one of $h_1$ and $h_2$ to d is about 1.67:1.

In some embodiments, the first cylinder-shaped magnet's inner diameter is $id_1$, and the ratio of $id_1$ to d is from about 0.2:1 to about 10:1. Thus, in some embodiments, the ratio of $id_1$ to d is from about 0.5:1 to about 10:1, from about 1:1 to about 10:1, from about 2:1 to about 10:1, from about 3:1 to about 10:1, from about 4:1 to about 10:1, from about 5:1 to about 10:1, from about 6:1 to about 10:1, from about 7:1 to about 10:1, from about 8:1 to about 10:1, or from about 9:1 to about 10:1. In some embodiments, the ratio of $id_1$ to d is from about 0.5:1 to about 9:1, from about 1:1 to about 9:1, from about 2:1 to about 9:1, from about 3:1 to about 9:1, from about 4:1 to about 9:1, from about 5:1 to about 9:1, from about 6:1 to about 9:1, from about 7:1 to about 9:1, or from about 8:1 to about 9:1. In some embodiments, the ratio of $id_1$ to d is from about 0.5:1 to about 8:1, from about 0.75:1 to about 8:1, from about 2:1 to about 8:1, from about 3:1 to about 8:1, from about 4:1 to about 8:1, from about 5:1 to about 8:1, from about 6:1 to about 8:1, or from about 7:1 to about 8:1.

In some embodiments, the ratio of $id_1$ to d is from about 0.5:1 to about 4:1, from about 0.75:1 to about 3:1, from about 1:1 to about 2:1, from about 1.5:1 to about 2:1, or from about 1.6:1 to about 1.8.

In some embodiments, the ratio of $id_1$ to d is about 1.67:1.

In some embodiments, the first cylinder-shaped magnet's outer diameter is $od_1$; and the ratio of $od_1$ to d is from about 0.3:1 to about 100:1. Thus, in some embodiments, the ratio of $od_1$ to d is from about 0.5:1 to about 50:1, from about 1:1 to about 50:1, from about 2:1 to about 50:1, from about 3:1 to about 50:1, from about 4:1 to about 50:1, from about 5:1 to about 50:1, from about 6:1 to about 50:1, from about 7:1 to about 50:1, from about 8:1 to about 50:1, from about 9:1 to about 50:1 or from about 10:1 to about 50:1. In some embodiments, the ratio of $od_1$ to d is from about 1:1 to about 10:1, from about 2:1 to about 9:1, from about 3:1 to about 8:1, from about 4:1 to about 7:1, from about 4:1 to about 6:1, or from about 4:1 to about 5:1.

In some embodiments, the ratio of $od_1$ to d is about 5:1.

In some embodiments, the ratio of the first cylinder-shaped magnet's inner diameter ($id_1$):outer diameter ($od_1$):height ($h_1$):distance between the surfaces of the like-poles of the first and second cylinder-shaped magnets (d) is about 1-5:1-10:1-5:1. In some embodiments, the ratio of the first cylinder-shaped magnet's inner diameter ($id_1$):outer diameter ($od_1$):height ($h_1$):distance between the surfaces of the like-poles of the first and second cylinder-shaped magnets (d) is about 1-3:2-8:1-3:1. In some embodiments, the ratio of the first cylinder-shaped magnet's inner diameter ($id_1$):outer diameter ($od_1$):height ($h_1$):distance between the surfaces of the like-poles of the first and second cylinder-shaped magnets (d) is about 1-2:3-6:1-2:1. In some embodiments, the ratio of the first cylinder-shaped magnet's inner diameter ($id_1$):outer diameter ($od_1$):height ($h_1$):distance between the surfaces of the like-poles of the first and second cylinder-shaped magnets (d) is about 1.67:5:1.67:1.

In some embodiments, the second cylinder-shaped magnet's inner diameter is $id_2$, and the ratio of $id_2$ to d is from about 0.2:1 to about 10:1. Thus, in some embodiments, the ratio of $id_2$ to d is from about 0.5:1 to about 10:1, from about 1:1 to about 10:1, from about 2:1 to about 10:1, from about 3:1 to about 10:1, from about 4:1 to about 10:1, from about 5:1 to about 10:1, from about 6:1 to about 10:1, from about 7:1 to about 10:1, from about 8:1 to about 10:1, or from about 9:1 to about 10:1. In some embodiments, the ratio of $id_2$ to d is from about 0.5:1 to about 9:1, from about 1:1 to about 9:1, from about 2:1 to about 9:1, from about 3:1 to about 9:1, from about 4:1 to about 9:1, from about 5:1 to about 9:1, from about 6:1 to about 9:1, from about 7:1 to about 9:1, or from about 8:1 to about 9:1. In some embodiments, the ratio of $id_2$ to d is from about 0.5:1 to about 8:1, from about 0.75:1 to about 8:1, from about 2:1 to about 8:1, from about 3:1 to about 8:1, from about 4:1 to about 8:1, from about 5:1 to about 8:1, from about 6:1 to about 8:1, or from about 7:1 to about 8:1.

In some embodiments, the ratio of $id_2$ to d is from about 0.5:1 to about 4:1, from about 0.75:1 to about 3:1, from about 1:1 to about 2:1, from about 1.5:1 to about 2:1, or from about 1.6:1 to about 1.8.

In some embodiments, the ratio of $id_2$ to d is about 1.67:1.

In some embodiments, the second cylinder-shaped magnet's outer diameter is $od_2$; and the ratio of $od_2$ to d is from about 0.3:1 to about 100:1. Thus, in some embodiments, the ratio of $od_2$ d is from about 0.5:1 to about 50:1, from about 1:1 to about 50:1, from about 2:1 to about 50:1, from about 3:1 to about 50:1, from about 4:1 to about 50:1, from about 5:1 to about 50:1, from about 6:1 to about 50:1, from about 7:1 to about 50:1, from about 8:1 to about 50:1, from about 9:1 to about 50:1 or from about 10:1 to about 50:1. In some embodiments, the ratio of ode to d is from about 1:1 to about 10:1, from about 2:1 to about 9:1, from about 3:1 to about 8:1, from about 4:1 to about 7:1, from about 4:1 to about 6:1, or from about 4:1 to about 5:1.

In some embodiments, the ratio of ode to d is about 5:1.

In some embodiments, the ratio of the second cylinder-shaped magnet's inner diameter ($id_2$):outer diameter ($od_2$):height ($h_2$):distance between the surfaces of the like-poles of the first and second cylinder-shaped magnets (d) is about 1-5:1-10:1-5:1. In some embodiments, the ratio of the second cylinder-shaped magnet's inner diameter ($id_2$):outer diameter ($od_2$):height ($h_2$):distance between the surfaces of the like-poles of the first and second cylinder-shaped magnets (d) is about 1-3:2-8:1-3:1. In some embodiments, the ratio of the second cylinder-shaped magnet's inner diameter ($id_2$):outer diameter (ode):height ($h_2$):distance between the surfaces of the like-poles of the first and second cylinder-shaped magnets (d) is about 1-2:3-6:1-2:1. In some embodiments, the ratio of the second cylinder-shaped magnet's inner diameter ($id_2$):outer diameter ($od_2$):height ($h_2$):distance between the surfaces of the like-poles of the first and second cylinder-shaped magnets (d) is about 1.67:5:1.67:1.

In some embodiments, the second cylinder-shaped cavity 111 spans through the entire height of the second cylinder-shaped magnet 103 and coaxially aligned with the second cylinder-shaped magnet 103; and the first and/or second cylinder-shaped magnet's inner diameter is from about 15 mm to about 40 mm. In some embodiments, the first or second cylinder-shaped magnet's inner diameter is from about 15 mm to about 40 mm, from about 20 mm to about 30 mm, or from about 22 mm to about 27 mm. In some embodiments, the first and/or second cylinder-shaped magnet's inner diameter is about 25 mm.

In some embodiments, the first and/or second cylinder-shaped magnet's outer diameter is from about 50 mm to about 100 mm. In some embodiments, the first and/or second cylinder-shaped magnet's outer diameter is from about 60 mm to about 90 mm. In some embodiments, the first and/or second cylinder-shaped magnet's outer diameter is from about 70 mm to about 80 mm. In some specific embodiments, the first or second cylinder-shaped magnet's outer diameter is about 75, 76, or 77 mm.

In some embodiments, the first and/or second cylinder-shaped magnet's height is from about 15 mm to about 50 mm, from about 15 mm to about 40 mm, from about 20 mm to about 30 mm, or from about 20 mm to about 25 mm. In some embodiments, the first or second cylinder-shaped magnet's height is about 25 mm.

In some embodiments, the distance between the surfaces of the like-poles of the first and second cylinder-shaped magnets is from about 5 mm to about 50 mm, from about 10 mm to about 50 mm, from about 10 mm to about 40 mm, from about 10 mm to about 30 mm, or from about 10 mm to about 20 mm. In some embodiments, the distance between the surfaces of the like-poles of the first and second cylinder-shaped magnets is about 15 mm.

In some embodiments, the maximal magnetic field along the common axis of the first and second cylinder-shaped magnets is about 0.20-0.50 T. In some specific embodiments, the maximum Bo along the central axis between the first and second cylinder-shaped magnets is ~0.33 T, and the linear magnetic field extends into the cavities of the ring magnets (approximately half of the distance of separation between the magnets). Without wishing to be bound by any particular theory, it is believed that the geometry of the device as described in one or more embodiments herein facilitates the performance of density-based analyses and separations of diamagnetic and weakly paramagnetic samples, and to exchange the paramagnetic medium surrounding the levitating objects (e.g., by moving the sample container relative to the magnets).

In some embodiments, the paramagnetic medium includes an aqueous solution of a paramagnetic compound. In some embodiments, the paramagnetic compound is selected from the group consisting of $MnCl_2$, $MnBr_2$, $CuSO_4$, $GdCl_3$, $DyCl_3$, $HoCl_3$, a Gd chelated compound, and a combination thereof. In some specific embodiments, the Gd chelated compound is gadolinium (III) diethylenetriaminepentaacetic acid.

In some embodiments, the paramagnetic medium includes an aqueous solution of $MnCl_2$. In some embodiments, the paramagnetic medium includes a hydrophobic paramagnetic medium or a paramagnetic ionic liquid.

In another aspect, a method of analyzing a diamagnetic or paramagnetic sample is described, including:
  providing the system of any one of the embodiments described herein;
  disposing a container configured to hold a paramagnetic medium between the first and the second cylinder-shaped magnets;
  adding a paramagnetic medium and a diamagnetic or paramagnetic sample, either separately or together, into the container; and
  allowing the diamagnetic or paramagnetic sample to levitate under the linear magnetic field between the first and second cylinder-shaped magnets.

In some embodiments, the paramagnetic medium or the diamagnetic or paramagnetic sample is added through the first cylinder-shaped cavity. In some embodiments, the method further includes removing the paramagnetic medium or the diamagnetic or paramagnetic sample. In some embodiments, the paramagnetic medium or the diamagnetic or paramagnetic sample is removed through the first cylinder-shaped cavity.

In some embodiments, the paramagnetic medium includes an aqueous solution of a paramagnetic compound, a hydrophobic paramagnetic medium, or a paramagnetic ionic liquid. In some embodiments, the paramagnetic compound is selected from the group consisting of $MnCl_2$, $MnBr_2$, $CuSO_4$, $GdCl_3$, $DyCl_3$, $HoCl_3$, a Gd chelated compound, and a combination thereof. In some embodiments, the Gd chelated compound is gadolinium (III) diethylenetriaminepentaacetic acid. In some embodiments, the paramagnetic medium includes an aqueous solution of $MnCl_2$. In some embodiments, the paramagnetic medium further includes cetyltrimethylammonium bromide. In some specific embodiments, the diamagnetic or paramagnetic includes a crosslinked polymer.

In some embodiments, the method further includes determining the density of the crosslinked polymer. In some embodiments, the method further includes generating a standard curve correlating a sample's levitation height in the system with its density and determining the density of the crosslinked polymer using the standard curve and its levitation height in the system. In some embodiments, the crosslinked polymer comprises PDMS.

Although the terms, first, second, third, etc., may be used herein to describe various elements, these elements are not to be limited by these terms. These terms are simply used to distinguish one element from another. Thus, a first element, discussed below, could be termed a second element without departing from the teachings of the exemplary embodiments. Spatially relative terms, such as "above," "below," "left," "right," "in front," "behind," and the like, may be used herein for ease of description to describe the relationship of one element to another element, as illustrated in the figures. It will be understood that the spatially relative terms, as well as the illustrated configurations, are intended to encompass different orientations of the apparatus in use or operation in addition to the orientations described herein and depicted in the figures. For example, if the apparatus in the figures is turned over, elements described as "below" or "beneath" other elements or features would then be oriented "above" the other elements or features. Thus, the exemplary term, "above," may encompass both an orientation of above and below. The apparatus may be otherwise oriented (e.g., rotated 90 degrees or at other orientations) and the spatially relative descriptors used herein interpreted accordingly. Further still, in this disclosure, when an element is referred to as being "linked to," "on," "connected to," "coupled to," "in contact with," etc., another element, it may be directly linked to, on, connected to, coupled to, or in contact with the other element or intervening elements may be present unless otherwise specified.

The terminology used herein is for the purpose of describing particular embodiments and is not intended to be limiting of exemplary embodiments. In certain embodiments, singular forms, such as "a" and "an," are intended to include the plural forms as well, unless the context indicates otherwise. Additionally, the terms, "includes," "including," "comprises" and "comprising," specify the presence of the stated elements or steps but do not preclude the presence or addition of one or more other elements or steps.

EXAMPLES

Certain embodiments will now be described in the following non-limiting examples.

Figure 1B:
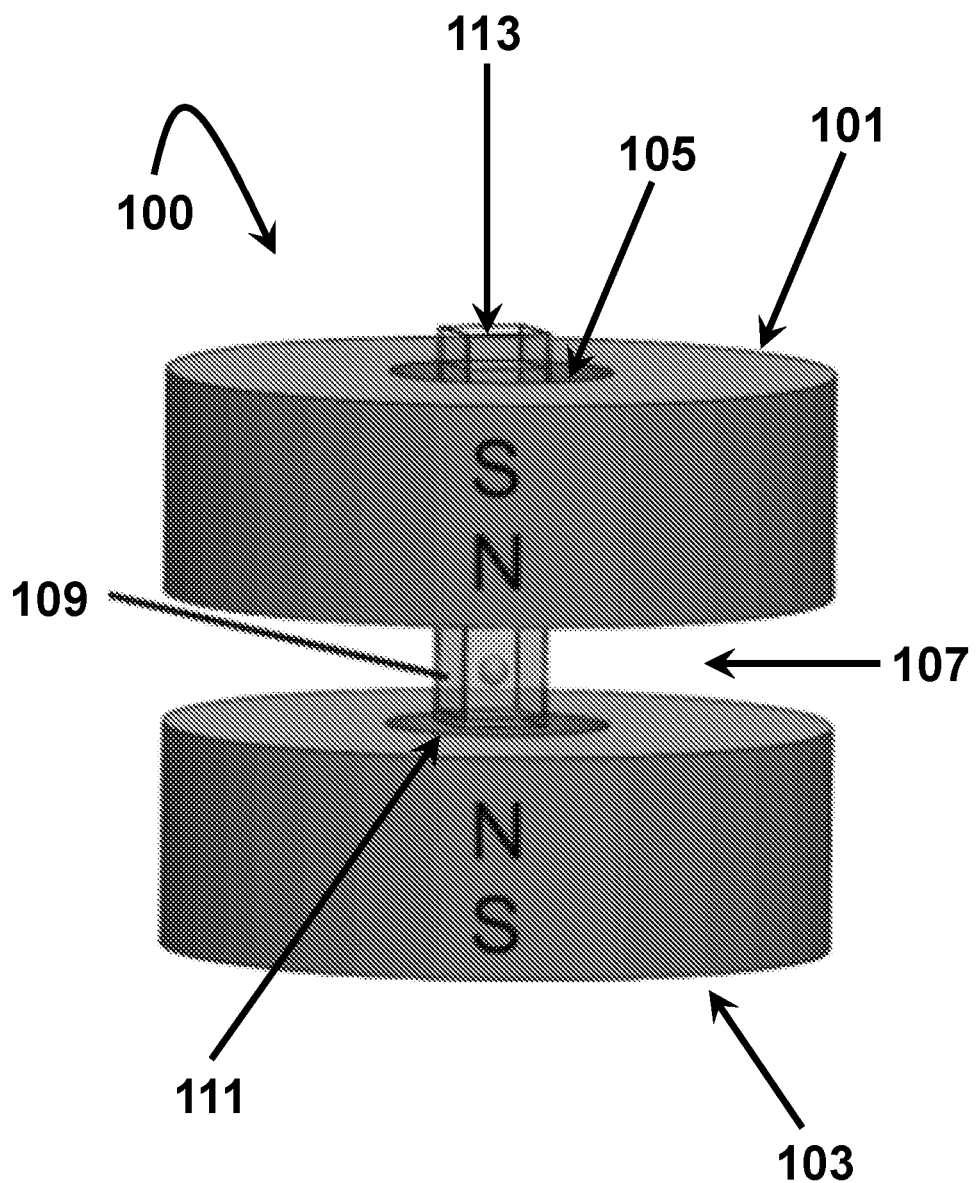
FIG. 1B shows an axial MagLev device including ring magnets positioned coaxially, according to one or more embodiments described herein.

FIG. 1A exemplifies a MagLev device configuration according to some embodiments, comprising two like-poles facing, block magnets (e.g., NdFeB permanent magnets, W×L×H: 50.8 mm×50.8 mm×25.4 mm) positioned coaxially with a distance of separation of 45.0 mm. In some embodiments, a cuvette (e.g., 45 mm in height) is a common container used to levitate diamagnetic samples (represented by a 3 mm sphere in FIG. 1A) in a paramagnetic medium (e.g., aqueous solutions of $MnCl_2$).

In some embodiments, an axial MagLev device includes cylinder-shaped magnets, e.g., ring magnets, which results in a configuration that removes the physical barriers to physical sampling in the magnetic field that are present in the MagLev device of FIG. 1A. Therefore, in some embodiments, axial MagLev simplifies the procedures used to carry out density-based analyses, separations, and manipulations. In certain embodiments, the optimized, linear magnetic field generated between the two ring magnets (coaxially aligned and like-poles facing) enables the levitation of diamagnetic (and weakly paramagnetic; e.g., aluminum) materials in a paramagnetic suspending medium, and makes density measurements more straightforward. In certain embodiments, the axial configuration enables (i) the addition of samples and/or paramagnetic medium from an open end of the container, and the retrieval of samples from the container while they are levitating in the magnetic field (e.g., a sub-population of a cluster of small particles); (ii) the ability to view the samples 360° around the sample container and from its top and the bottom; and (iii) convenient density measurements of small quantities (as small as a single sub-millimeter particle, as demonstrated) of samples. The compact design, portability, affordability, and simplicity in use of the axial MagLev device will broaden the uses of magnetic methods in analyzing, separating, and/or manipulating different types of samples (e.g., solids, liquids, powders, pastes, gels, and biological entities) in areas such as, for example, materials sciences, chemistry, and biochemistry.

In some embodiments, a pair of ring magnets were positioned with like-poles facing (analogous to the anti-Helmholtz configuration using electromagnets) to engineer a linear, axially-symmetric magnetic field, and this field used to levitate diamagnetic and weakly paramagnetic (e.g., aluminum) objects in a paramagnetic medium (e.g., aqueous solutions of $MnCl_2$ or $GdCl_3$) for density-based analyses, separations, and manipulations (FIG. 1B). In some embodiments, the use of a linear magnetic field between the ring magnets helps simplify the procedures with which to calibrate and carry out density measurements. In other embodiments, the nonlinear portion of the magnetic field, particularly the field in the cavity of the ring magnet, can also be used to perform density-based separations and manipulations.

FIG. 1B exemplifies an axial MagLev device, including two like-poles facing ring magnets (e.g., NdFeB permanent magnets, OD×ID×H: 76.2 mm×25.4 mm×25.4 mm) positioned coaxially with a distance of separation of 15.0 mm, according to one or more embodiments. In these embodiments, a cuvette containing the sample (represented by a 3 mm sphere in FIG. 1B) is included to show the size of the devices.

In some embodiments, the size and aspect ratios of the magnets were optimized to yield a linear magnetic field. In certain embodiments, the maximum Bo along the central axis between the magnets is about 0.3 T, 0.4 T, 0.5 T, 0.6 T, 0.7 T, 0.8 T, 0.9 T 1.0 T, or in a range bounded by any two values disclosed herein. In certain embodiments, the maximum Bo along the central axis between the magnets is ~0.33 T, and the linear magnetic field extends into the cavities of the ring magnets (approximately half of the distance of separation between the magnets). In these embodiments, this geometry made it possible to perform density-based analyses and separations of diamagnetic and weakly paramagnetic samples, and to exchange the paramagnetic medium surrounding the levitating objects (e.g., by moving the sample container relative to the magnets).

In some embodiments, the axial MagLev configuration using two ring magnets makes a number of new procedures either accessible, or more convenient than those for conventional MagLev. Because, in some embodiments, both the top and bottom of the sample container are easily accessible in this axial configuration, it is straightforward to recover samples, and to exchange the paramagnetic medium surrounding the levitating objects, without having to remove the sample container from the magnetic field.

Design of the Device

Figure 2A:
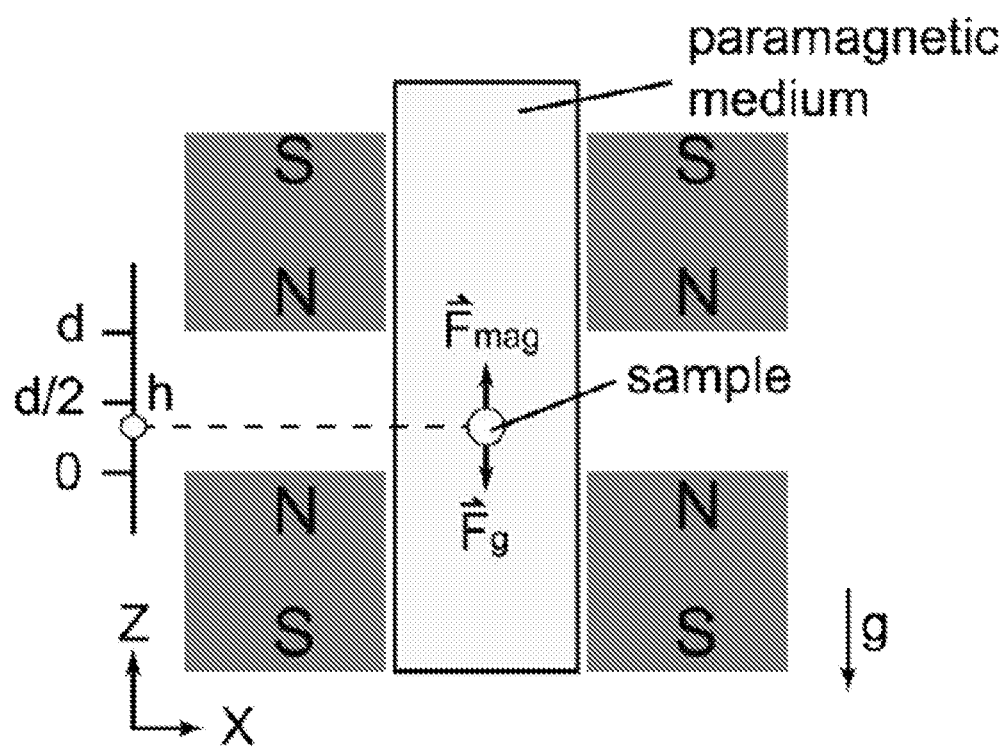
FIG. 2A shows a pair of indistinguishable magnets arranged coaxially with the like-poles facing and a diamagnetic sample levitating in a paramagnetic medium, according to one or more embodiments described herein.

In some embodiments, two ring magnets (e.g., NdFeB permanent magnets) were positioned coaxially with like-poles facing such that the gradient of the magnetic field between the magnets is linear, and then the central axis aligned with the gravity vector. As shown in FIG. 2A, the magnetic field was simulated using Comsol® to optimize the geometry of the ring magnets, including the inner diameter (id), the outer diameter (od), the height of the magnets (h), and the distance of separation between the magnets (d), to maximize the strength of the linear magnetic field between them. In some embodiments, the "homothetic" property of the magnetic field generated by permanent magnet(s) was utilized, i.e., the spatial profile (that is its spatial distribution) of the magnetic field remains unchanged while the magnet(s) physical size increases or decreases. In some embodiments, the "aspect-ratio" of the magnets (i.e., id:od:h:d) was thus optimized to maximize the strength of the field (see FIGS. 6A-6F and Table 2 for details). The results of these simulations suggest, in some embodiments, that the strength of the magnetic field between the magnets can be linear for Bo up to about 0.4 T or 0.5 T. While the linear gradient in the gap between the magnets was focused, the entire range of the linear gradient, in some embodiments, extends slightly into the cavities of the ring magnets, and is approximately the size of the inner diameter of the ring magnet for the setup shown in FIG. 1B.

Figure 2B:
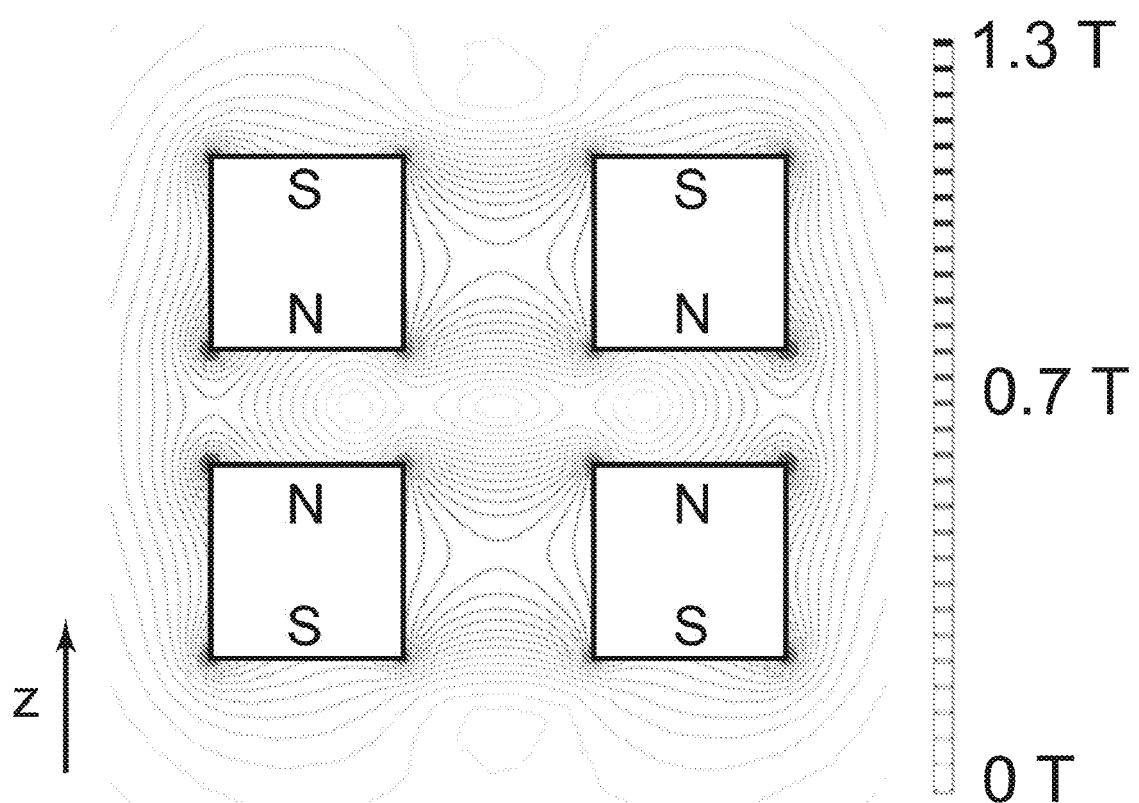
FIG. 2B shows the spatial profile of the magnetic field on the vertical cross-section through the central axis, according to one or more embodiments described herein.
Figure 2C:
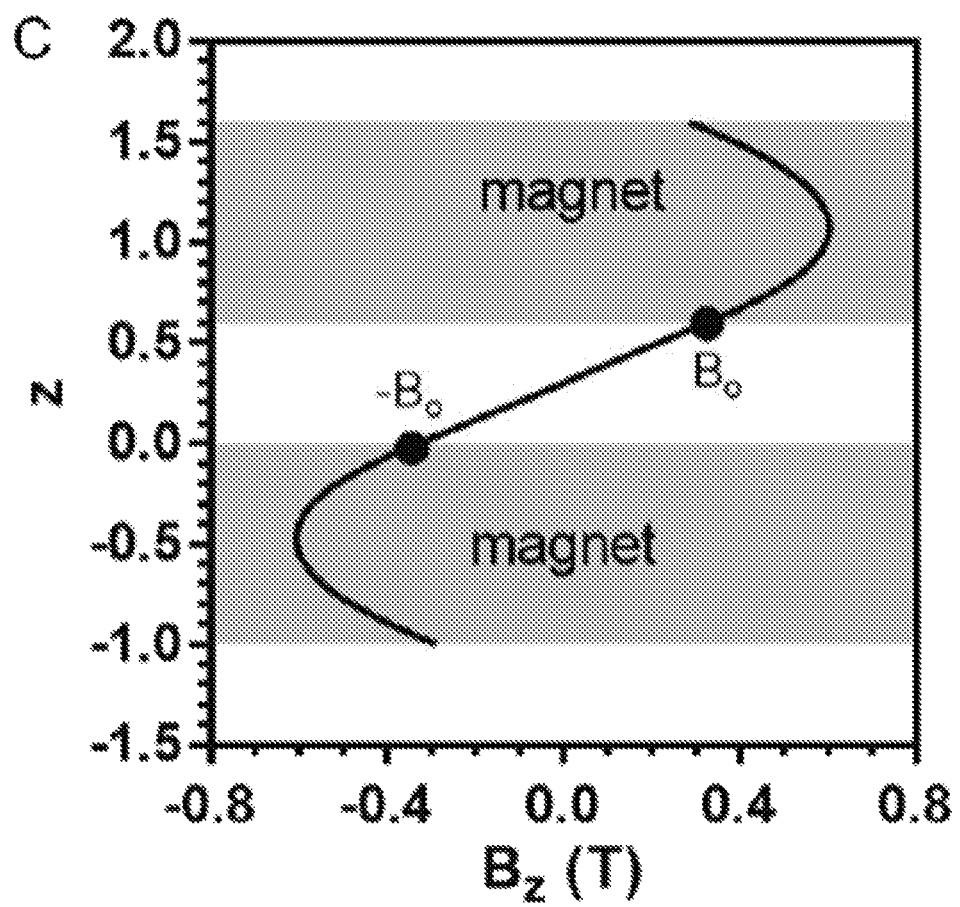
FIG. 2C shows the magnetic field strength, Bz, along the vertical dotted line in FIG. 2B, according to one or more embodiments described herein.

FIGS. 2A-2C show the design of the axial MagLev device using ring magnets, according to one or more embodiments. FIG. 2A shows a pair of indistinguishable magnets arranged coaxially with the like-poles facing (inner diameter:outer diameter:height:distance of separation=1:3:1:0.6), and a diamagnetic object (sample) levitating in a paramagnetic medium, according to one or more embodiments. In these embodiments, the z-axis of the setup was anti-aligned with the vector of gravity. FIG. 2B shows the spatial profile of the magnetic field on the vertical cross-section through the central axis (the central axis overlaps with the vertical dotted line), according to one or more embodiments. FIG. 2C shows the magnetic field strength, Bz, along the vertical dotted line in (FIG. 2B), according to one or more embodiments. Bo=~0.33 T for the configuration shown here using two N45-grade NdFeB permanent magnets. The z-axis is unitless for this plot.

In some embodiments, two NdFeB ring magnets were used, with the same shape (76 mm in outer diameter, 25 mm in inner diameter, and 25 mm in height) positioned apart by 15 mm. Without wishing to be bound by any particular theory, it is believed that, in some embodiments, this configuration (i) generates a strong, linear field between the magnets (Bo=~0.33 T); (ii) has a large working distance between the magnets (15 mm); (iii) is compact, and thus facilitates sample viewing (as opposed to configurations using magnets with a larger ratio of od to id); (iv) uses magnets that are commercially available; and (v) uses magnets that are relatively inexpensive (e.g., ~$50 per magnet). In some embodiments, 3D-printed plastic housing, metal rods, and screws were used to mechanically secure the magnets in space (FIGS. 7A-7B). In some embodiments, rings of different sizes, and also in combination with one or more flux concentrators (e.g., soft iron plate), may also be used to shape the magnetic field, and thus to levitate diamagnetic objects.

Figure 8A:
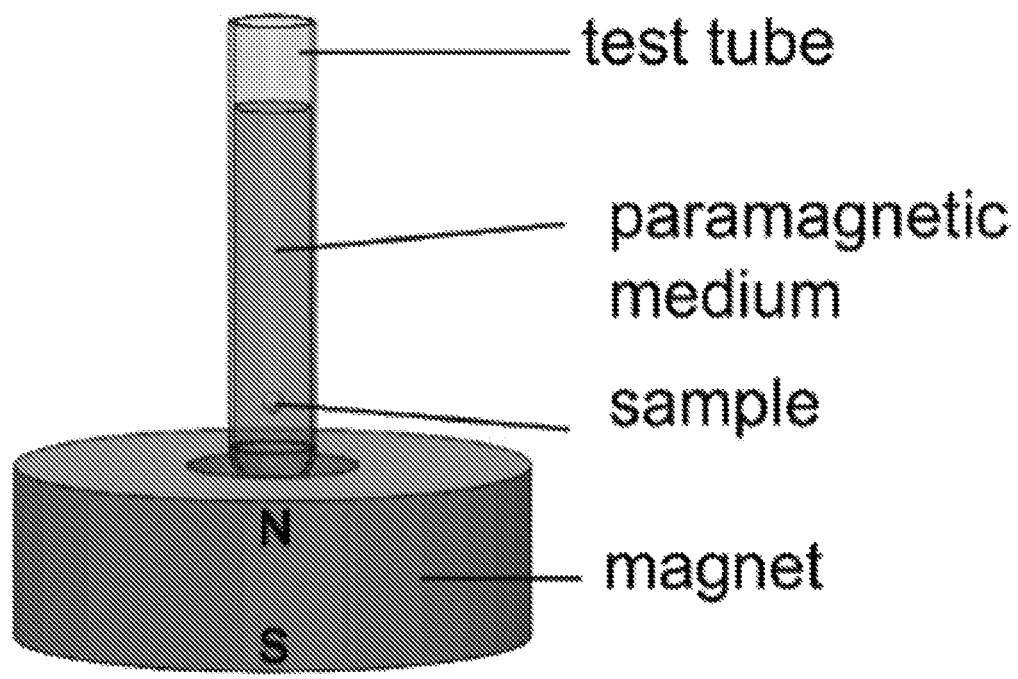
FIG. 8A shows a magnetic levitation using a single ring magnet, according to one or more embodiments described herein.
Figure 8B:
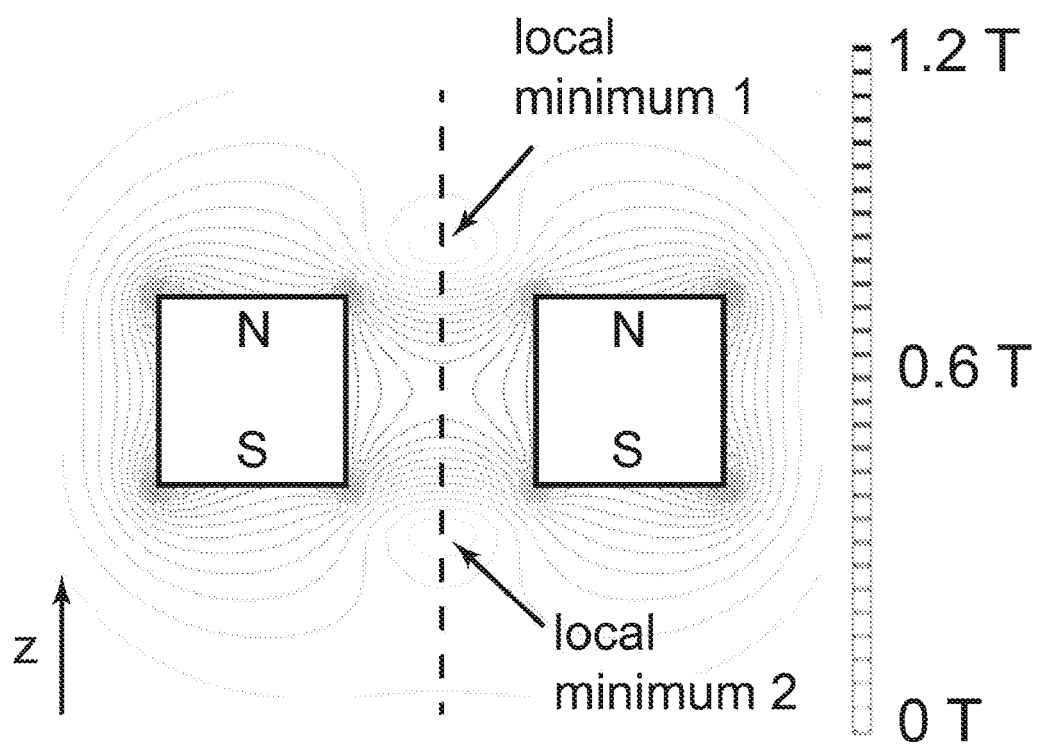
FIG. 8B shows the magnetic field of the single ring magnet of FIG. 8A, according to one or more embodiments described herein.

As shown in FIG. 8A, a single ring magnet with two local minima in its field strength along its central axis was used to levitate diamagnetic objects in a paramagnetic medium, according to one or more embodiments. It was found that, in these embodiments, this spatial profile of the field resulted in nonlinear magnetic field along the central axis on either side, instead of a linear magnetic field as generated in the axial MagLev system disclosed herein (e.g., the axial MagLev system of FIG. 1B). In some embodiments, an optimized, linear magnetic field simplifies the process by which to calibrate and carry out density measurements. Moreover, in some embodiments, the axial MagLev configuration enables (i) facile addition of samples and/or paramagnetic medium from an open end of the container, and retrieval of samples while they levitate in the magnetic field (e.g., a sub-population of a cluster of small particles); (ii) the ability to view the samples 360° around the sample container and from the top and the bottom; and (iii) convenient density measurements of small quantities (as small as a single sub-millimeter particle as demonstrated) of samples.

Choice of Paramagnetic Medium

In some embodiments, an aqueous solution of a paramagnetic species (e.g., $MnCl_2$, $MnBr_2$, $CuSO_4$, $GdCl_3$, $DyCl_3$, $HoCl_3$, and Gd chelates (e.g., gadolinium (III) diethylenetriaminepentaacetic acid) was used to suspend objects. In some embodiments, these paramagnetic species are inexpensive, transparent in the visible region of the spectrum (even at high concentrations), and commercially available. In some embodiments, MagLev also works with hydrophobic paramagnetic media and paramagnetic ionic liquids.

Choice of Crosslinked Polymeric Materials and Solvents to Measure Swelling Ratios In some embodiments, axial MagLev was used to measure the swelling ratios of crosslinked polymer materials, particularly those of irregular shapes and in small quantities, in hydrophobic solvents by measuring the densities of both the dry and fully swollen samples using an aqueous $MnCl_2$ suspension medium.

In some embodiments, the swelling ratio (the volumetric ratio) of a crosslinked polymer material may characterize its tendency to swell by adsorption of solvents (that is the absorption of a solvent into the crosslinked network of the material). In some embodiments, this ratio reflects, in part, the crosslink density present in the polymeric material and the way in which the solvent interacts with polymeric chains; it is, therefore, a useful parameter in characterizing the crosslinked polymer across different fields, such as solid-phase organic synthesis, development of superabsorbent materials, and use of polymeric materials for drug releasing applications.

In some embodiments, a number of techniques can be used to measure the swelling ratio of crosslinked polymeric materials, including the use of graduated cylinders (to track the bulk volume, e.g., of a collection of particles), gravimetric techniques (to weigh the sample), optical microscopy (to measure the dimension of the sample), and specialized instrumentations. These techniques, however, in some embodiments, can be tedious, require large quantity of samples (on the scale of grams), and/or have limited compatibility with different types of samples (e.g., irregularly-shaped samples, powders, and delicate or gel-like materials).

In some embodiments, axial MagLev was developed as a simple and broadly compatible tool to measure the swelling ratios of crosslinked polymeric materials in solvents. In some embodiments, crosslinked PDMS was chosen as a model material for this demonstration. The swelling behavior of PDMS in a variety of organic solvents (in the context of developing PDMS-based microfluidic devices) has been characterized.

In some embodiments, the axial MagLev technique used an aqueous solution of $MnCl_2$ to levitate samples; the solvents used to swell PDMS samples should not dissolve in the aqueous solutions. Among the 39 solvents characterized in the previous study, the following three exemplary hydrophobic solvents are studied here: chloroform, chlorobenzene, and toluene. In some embodiments, the use of water-miscible solvents can require the same compatibility of solubility of the sample (PDMS soaked with solvents) and the suspension medium (e.g., using hydrophobic Gd chelate dissolved in hydrophobic solvents).

Calibration

In some embodiments, hydrophobic organic liquids were used to calibrate the device because: (i) they have known densities; (ii) they can be used as small drops (e.g., 1-2 mm in diameter), a characteristic that facilitates accurate localization of the centroid (in comparison to the ~4 mm, often irregular-shaped standard glass beads commonly used); and (iii) they are commercially available. In some embodiments, the solubility of water in the hydrophobic solvents has a negligible influence on the density of the solvents. For example, in some embodiments, the solubility of water in chlorobenzene is 0.3 mol % at room temperature, and the dissolved water only causes a change in its density of less than 0.01%.

Figure 3A:
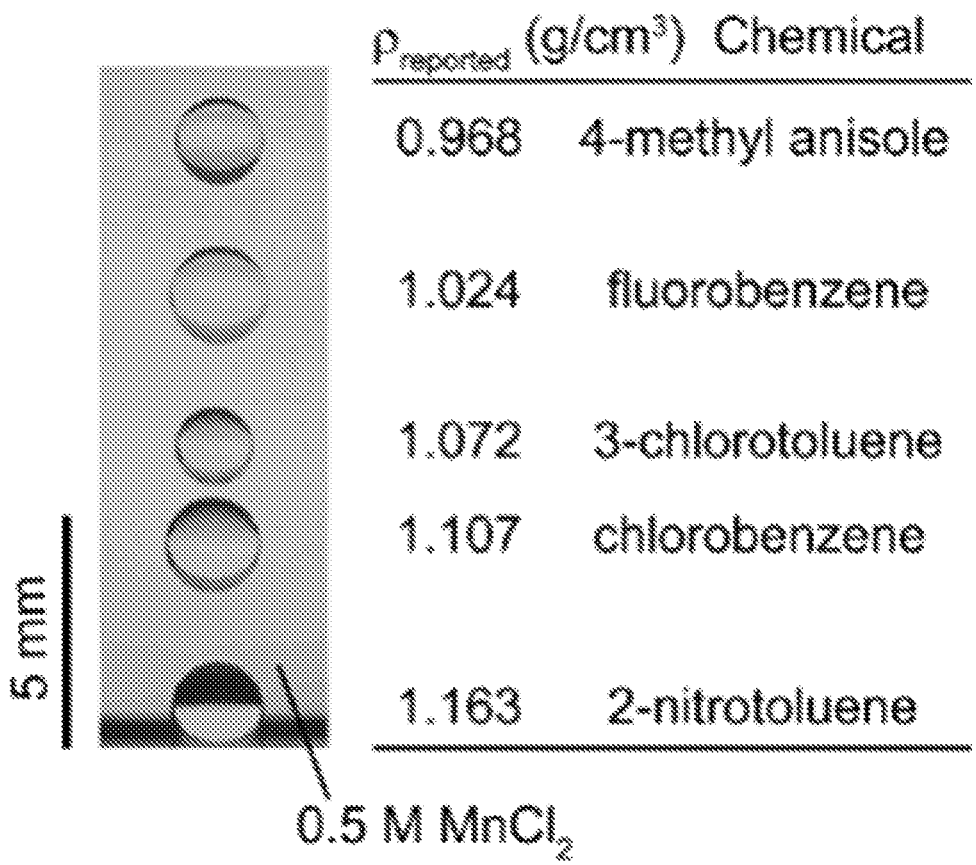
FIG. 3A shows the calibration of a MagLev device using a string of drops of water-insoluble organic liquids levitated in an aqueous solution of a paramagnetic medium, according to one or more embodiments described herein using aqueous $MnCl_2$ solutions.
Figure 3B:
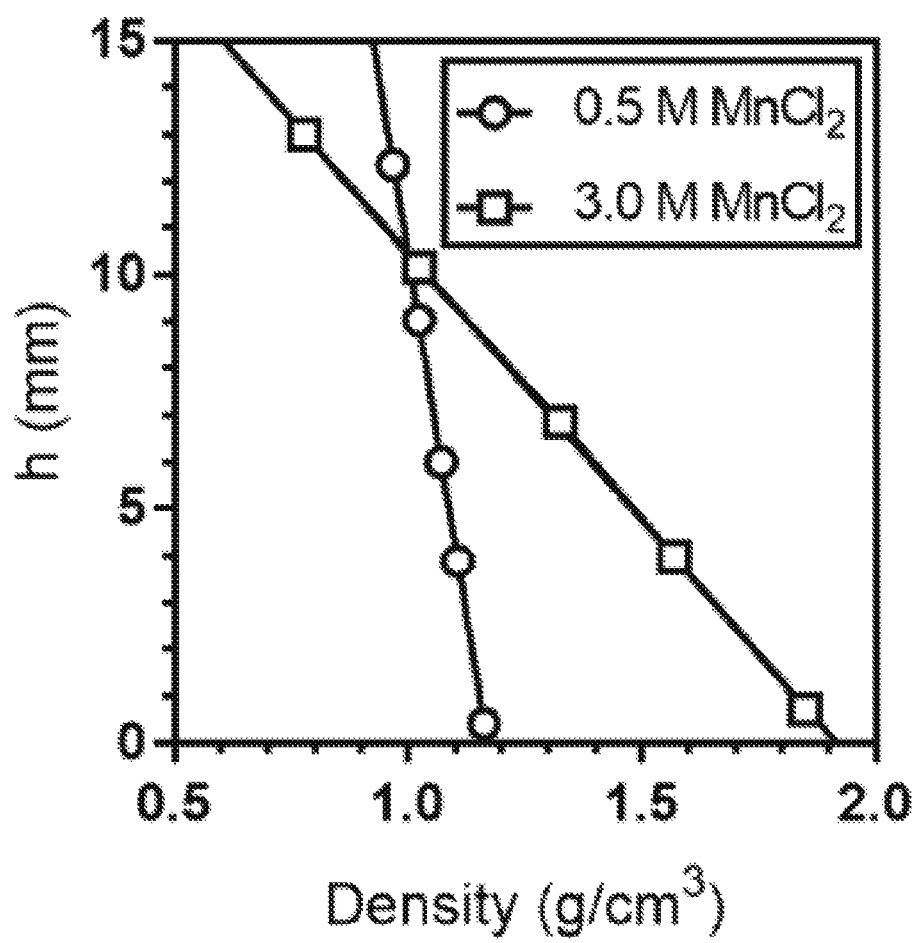
FIG. 3B shows the calibration curves resulting from the calibration shown in FIG. 3A, according to one or more embodiments described herein.

FIGS. 3A-3B show the calibration of the axial MagLev device using water-insoluble organic liquids, according to one or more embodiments. FIG. 3A shows a string of five drops (~3 mL) of organic liquids that were sequentially added to a square cuvette via a pipettor and levitated in an aqueous solution of 0.5 M $MnCl_2$, according to one or more embodiments. FIG. 3B shows the calibration curves obtained using aqueous $MnCl_2$ solutions, according to one or more embodiments. In these embodiments, a ruler with millimeter graduations was placed next to the cuvette (read to ±0.1 mm), and a digital camera used to take a photo of the drops. In some embodiments, levitation height h is the distance between the centroid of the drop and the upper surface of the bottom magnet (see FIG. 2A for an illustration of h). In some embodiments, the organic liquids used to calibrate the solution of 3.0 M $MnCl_2$ were cyclohexane ($\rho$=0.779 g/cm$^3$), fluorobenzene ($\rho$=1.024 g/cm$^3$), dichloromethane ($\rho$=1.325 g/cm$^3$), 1,1,2-trichlorotrifluoroethane ($\rho$=1.57 g/cm$^3$), and FC40 ($\rho$=1.85 g/cm$^3$). In these embodiments, the equations for the linear fits were h=−61.5$\rho$+71.9 ($R^2$=0.9997) for 0.5 M $MnCl_2$ and h=−11.4$\rho$+21.9 ($R^2$=0.9999) for 3.0 M $MnCl_2$. In these embodiments, all densities were taken from values reported by Sigma-Aldrich. The data were plotted as mean±standard deviation (N=7 for all measurements). The error bars were much smaller than the size of the symbols, and thus, are invisible on the plot. In some embodiments, the levitation heights of the drops did not change over the 30 min period.

Range of Densities that can be Measured

Figure 4:
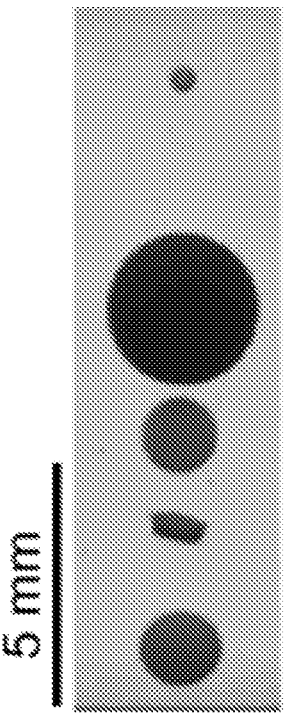
FIG. 4 shows the expanded range of densities that can be analyzed using axial MagLev, according to one or more embodiments described herein.

In some embodiments, as shown in FIG. 4, objects were levitated using a concentrated aqueous solution of 3.0 M $DyCl_3$ containing 0.01% (v/v) Tween-20, that ranged from a bubble of air ($\rho \approx 0$ g/cm$^3$) to zirconium silicate ($\rho \approx 3.7$ g/cm$^3$). In these embodiments, all samples were spherical except for the aluminum sample, which was irregular in shape (cut from a sheet of foil, 250 mm thickness). In some embodiments, a square cuvette (1 cm path length) was used to levitate the samples, and the following solvents were used to calibrate the device: cyclohexane ($\rho \approx 0.779$ g/cm$^3$), dichloromethane ($\rho \approx 1.325$ g/cm$^3$), 1,2-dibromoethane ($\rho \approx 2.18$ g/cm$^3$), and tribromomethane ($\rho \approx 2.89$ g/cm$^3$). In these embodiments, a linear fit of the data gave h=−3.43$\rho$+12.9 ($R^2$=0.9999). In some embodiments, the reported densities were obtained from the commercial vendors from which the materials were purchased (e.g., McMaster-Carr and Sigma-Aldrich). N=7 measurements.

In some embodiments, the combined use of a concentrated paramagnetic salt (e.g., $DyCl_3$) with a high magnetic susceptibility ($DyCl_3$=5.5×10$^7$ m$^3$/mol vs. $MnCl_2$=1.83×10$^{-7}$ m$^3$/mol) and a steep gradient in magnetic field strength (~43 T/m in axial MagLev vs. ~17 T/m in conventional MagLev) can lead to a wide accessible range of densities (from ~0 g/cm$^3$ to ~3.7 g/cm$^3$). In contrast, earlier work achieved only a range of ~0.8 g/cm$^3$ to ~3 g/cm$^3$ using an aqueous solution of $MnCl_2$ and the conventional MagLev device. In some embodiments, tilted MagLev—a variant of conventional MagLev in which the device is tilted with respect to the vector of gravity and the sample partially rests on the wall of the sample container while levitating along the central axis of the device—can measure the entire range of densities observed in matter at ambient conditions (from ~0 g/cm³ to ~23 g/cm³). In some embodiments, the axial MagLev system as disclosed herein demonstrated a range of densities that was expanded beyond that of conventional MagLev, was experimentally much more convenient, and avoided some of the potential problems of tilted MagLev (e.g., the samples rest on the walls of the sample container.)

Procedures to Add and/or Retrieve Samples

Figures 5A, 5B:
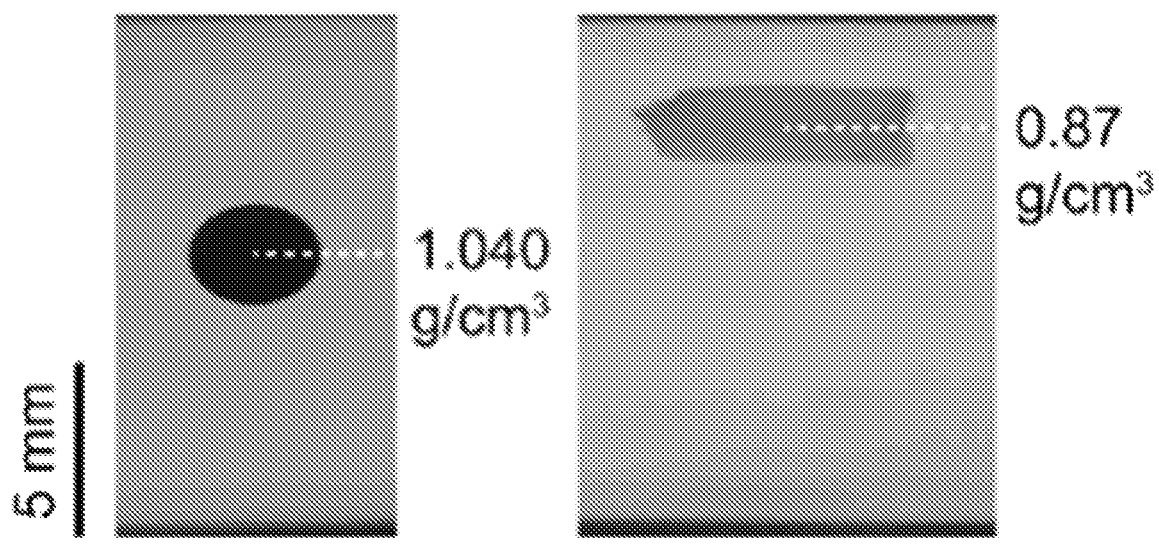
FIG. 5A shows a drop of liquid polydimethylsiloxane prepolymer levitated in an aqueous paramagnetic solution, according to one or more embodiments described herein.
FIG. 5B shows a plug of Vaseline® gel levitated in an aqueous paramagnetic solution, according to one or more embodiments described herein.
Figure 5C:
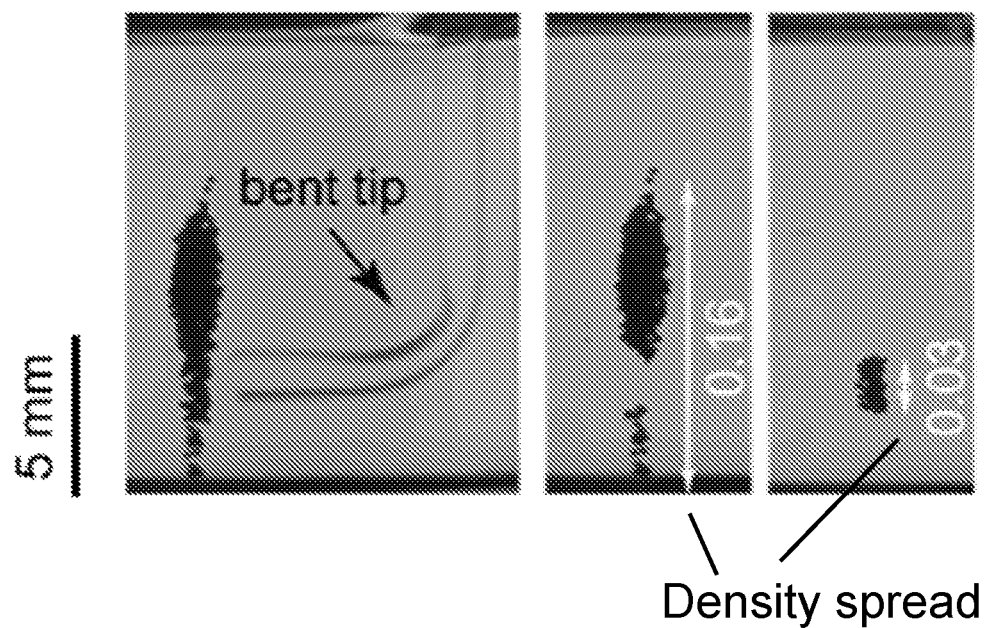
FIG. 5C shows the retrieval of a sub-population of density standard beads levitated in a paramagnetic solution, according to one or more embodiments described herein.

In some embodiments, the axial MagLev configuration conveniently enables addition and/or retrieval of samples from the container. FIGS. 5A-5C demonstrate these procedures, according to one or more embodiments, by levitating "sticky" or viscous samples (a drop of PDMS prepolymer and a plug of Vaseline® gel)—the type of samples that are inconveniently measured using the conventional or tilted MagLev devices as the samples tend to stick to the walls of the container, and also to the liquid-air interface. The axial MagLev configuration according to one or more embodiments also readily enables retrieval of a targeted fraction of a sample (e.g., from a collection of particles).

In some embodiments, a test tube filled with a paramagnetic medium was placed in the axial MagLev device, and the "sticky" samples added to the container from its top. In these embodiments, the sample entered the medium by gravity, and levitated in it (nearly instantaneously for mm sized samples, FIGS. 5A-5C).

FIGS. 5A-5B show procedures to add or retrieve samples, according to one or more embodiments. FIG. 5A shows a drop of liquid PDMS prepolymer (doped with black graphite powder for visualization) levitated in an aqueous solution of 0.5 M $MnCl_2$, according to one or more embodiments. In some embodiments, the drop appeared elliptical due to the visual distortion by the curved wall of the cylindrical test tube. FIG. 5B shows a plug of Vaseline® gel extruded from a syringe levitated in an aqueous solution of 3.0 M $MnCl_2$ containing 0.1% (v/v) Tween-20, according to one or more embodiments. FIG. 5C shows the retrieval of a sub-population of density standard beads, according to one or more embodiments. In some embodiments, the beads that were retrieved levitated at the same height from which they were originally removed (see third panel). In these embodiments, the suspension solution contained 0.5 M $MnCl_2$, 1.4 M NaCl (a diamagnetic co-solute used to match the densities of the particles and the solution), and 0.1% (v/v) Tween-20. As shown in FIG. 5C, arrows indicate the spread in density of the particles (unit: g/cm³) according to one or more embodiments.

In some embodiments, retrieving a sample from the container placed in the MagLev device is straightforward due to its axial configuration. Density standards (polyethylene particles, ~200 μm in diameter and 1.13 g/cm³ in nominal density) were used to demonstrate this in accordance with one or more embodiments. In certain embodiments, a glass Pasteur pipette with its tip bent ~90° was inserted from the top of the sample container (a test tube with a diameter of ~25 mm), and a sub-population of particles that levitated in an aqueous $MnCl_2$ solution were removed. In certain embodiments, the rest of the sample remained levitated and undisturbed. In certain embodiments, the removed fraction levitated, expectedly, at the same height in the same media when placed back to the device (FIG. 5C), but had a ~5-fold narrower distribution in density (thus improved precision). Axial MagLev as disclosed herein, thus, in embodiments, provides a straightforward method to prepare high-quality density standards.

Swelling Ratios of Crosslinked Polymers in Solvents

In some embodiments, PDMS was chosen as a model crosslinked polymer to demonstrate the use of axial MagLev in characterizing the swelling behavior of crosslinked polymers in solvents. In certain embodiments, a small piece of PDMS (1.5 mm in diameter and ~1 mm in thickness, which was prepared by a 1.5 mm biopsy punch) was immersed in solvent for 24 hours. In certain embodiments, the sample was blotted dry and added to the MagLev device for density measurement using an 1.5 M aqueous solution of $MnCl_2$ containing 0.1% (v/v) cetyltrimethylammonium bromide (a surfactant to help remove air bubbles). In some embodiments, MagLev enables direct measurement of the density of the sample, irrespective of its volume (or shape). In some embodiments, the measured densities were converted to the volumetric swelling ratio (see Table 1) using Equation 1.

$$f = \frac{V_{sp}}{V_p} = \frac{\rho_p - \rho_s}{\rho_{sp} - \rho_s} \quad (1)$$

In Equation 1, in some embodiments, $V_{sp}$ is the volume of the swollen sample, $V_p$ is the volume of the dry sample, $\rho_p$ is the density of the sample, $\rho_{sp}$ is the density of the swollen sample, and $\rho_s$ is the density of the solvent.

In some embodiments, the diameters of the dry and swollen samples from the same images were measured using the levitation heights, and the swelling ratio estimated. In some embodiments, the agreement of the results (within 10% deviation) validates the performance of the MagLev technique. In some embodiments, the divergence from literature values may have originated from different sample preparations. In some embodiments, this demonstration also highlights the simplicity and compatibility of the MagLev technique in measuring small quantities of samples without requiring more sophisticated tools (e.g., microscopes).

TABLE 1

Swelling ratios of PDMS samples in certain solvents.

| Solvent | Volumetric Swelling Ratio (f) | | |
|---|---|---|---|
| | MagLev[a] | Imaging[b] | Literature[c] |
| Chloroform | 2.1 | 1.9 | 2.7 |
| Chlorobenzene | 2.2 | 2.1 | 1.8 |
| Toluene | 2.2 | 2.2 | 2.2 |

[a]N = 3; average of 3 measurements.
[b]The volumetric swelling ratio was calculated using the equation f = (D/D₀)³, where D is the diameter of the swollen PDMS disc and D₀ is the diameter of the dry PDMS disc. Isotropic swelling of PDMS samples in the solvents was assumed. N = 3.
[c]Swelling ratios of small pieces of PDMS reported in Lee et al., "Solvent Compatibility of Poly(dimethylsiloxane)-Based Microfluidic Devices" 2003, Vol. 75, pp. 6544-6554. The following ratios of the length of a swollen PDMS sample to a dry sample were used: chloroform 1.39, chlorobenzene 1.22, toluene 1.31. These values were converted to volumetric swelling ratios.

In some embodiments, axial MagLev exploits the axially symmetric magnetic field generated by two like-poles facing ring magnets to carry out density-based analyses, separations, and manipulations. In some embodiments, this configuration of MagLev removes the physical barriers along the central axis of conventional MagLev devices in which sample containers (e.g., square cuvette or capillary tube) are physically sandwiched between two block magnets. In some embodiments, axial MagLev has four useful characteristics: (i) It provides ready access to the levitating sample and the paramagnetic medium, making it straightforward to add or remove the sample or the suspending medium: (ii) It maintains full clearance (360°) around the sample container by which to view the levitating samples, and also provides ready access to view the samples from both the top and the bottom. (iii) It does not impose a limitation on the height of the sample container, and is broadly compatible with different types of containers (e.g., cuvettes, vials, test tubes, graduated cylinders, etc.) so long they fit within the inner diameter of the ring magnets. (iv) It concentrates small and/or dilute particles along a common vertical axis, and aids in their visualization and manipulations.

In some embodiments, axial MagLev generates a linear magnetic field between the magnets. In certain embodiments, non-linear magnetic fields could also be used to carry out density-based measurements and separation, provided appropriate calibrations. In certain embodiments, the working distance between the two magnets can be extended at least to ~38 mm, while the monotonically changing the magnetic field gradient (and thus the density).

Figure 6A:
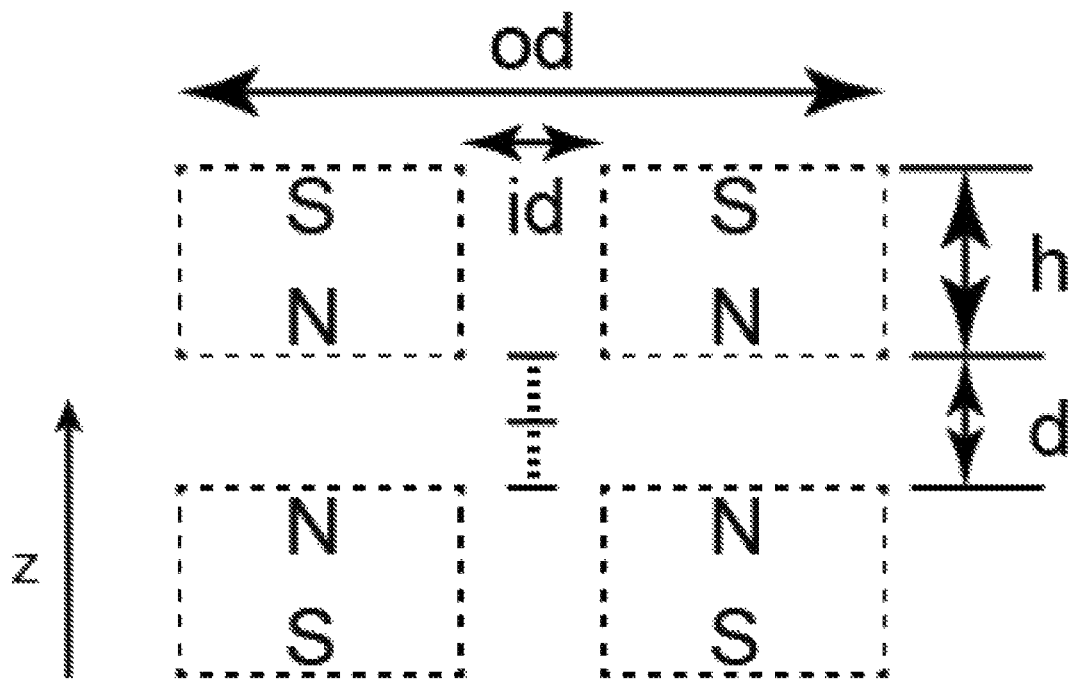
FIG. 6A is a schematic showing the four independent physical parameters used to define the configuration of the MagLev device, according to one or more embodiments described herein.
Figure 6B:
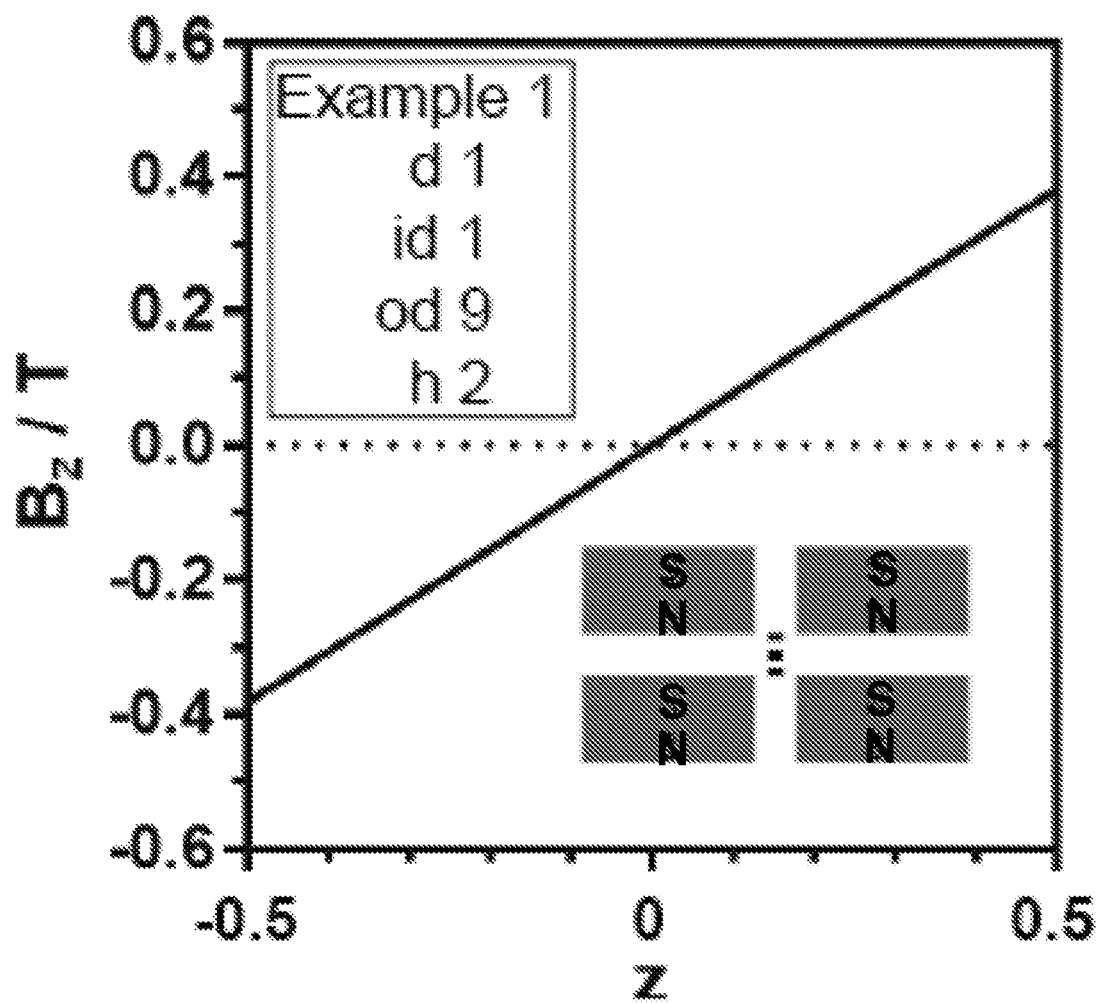
FIG. 6B shows an example of a linear gradient with a max field strength of ~0.4 T along the central axis between the magnets (dotted line in the inset), according to one or more embodiments described herein.
Figure 6C:
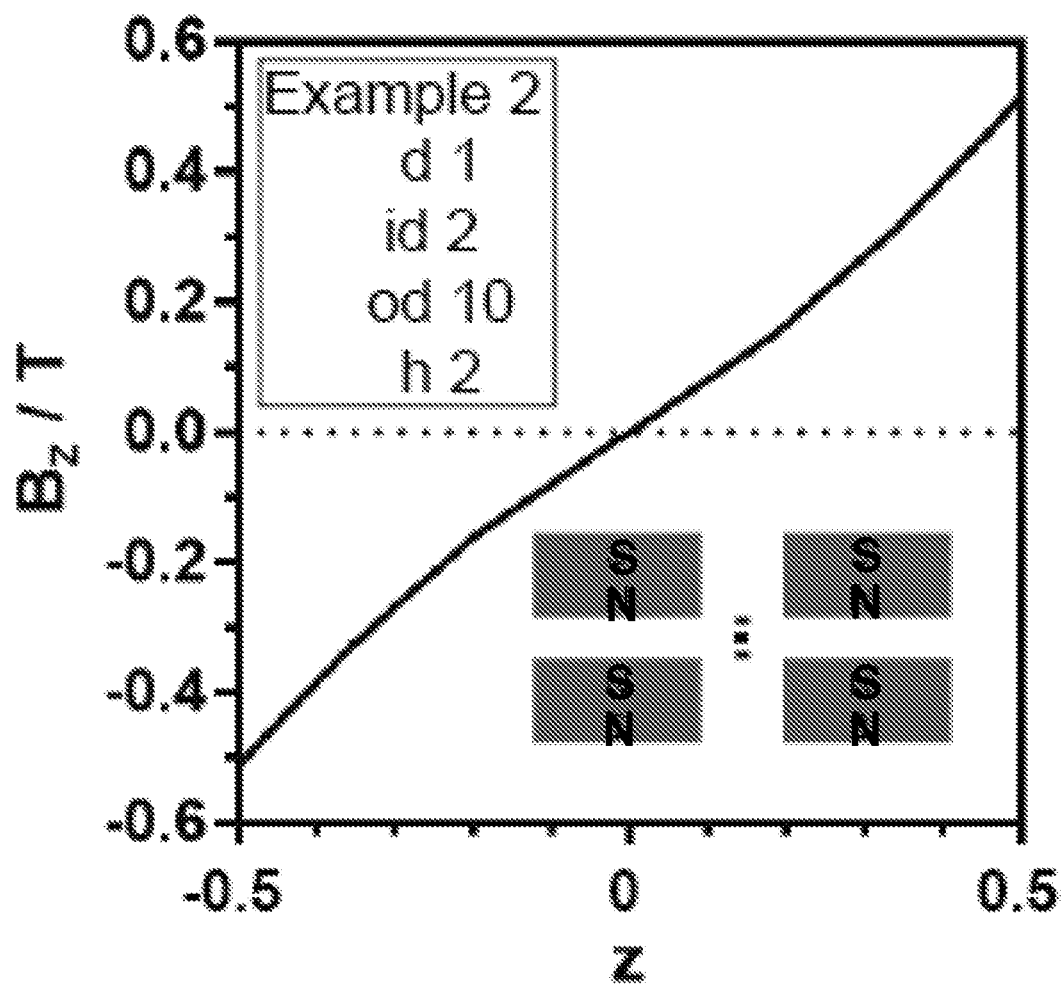
FIG. 6C shows an example of a non-linear gradient with a max field strength of ~0.5 T along the central axis between the magnets (dotted line in the inset), according to one or more embodiments described herein.
Figure 6D:
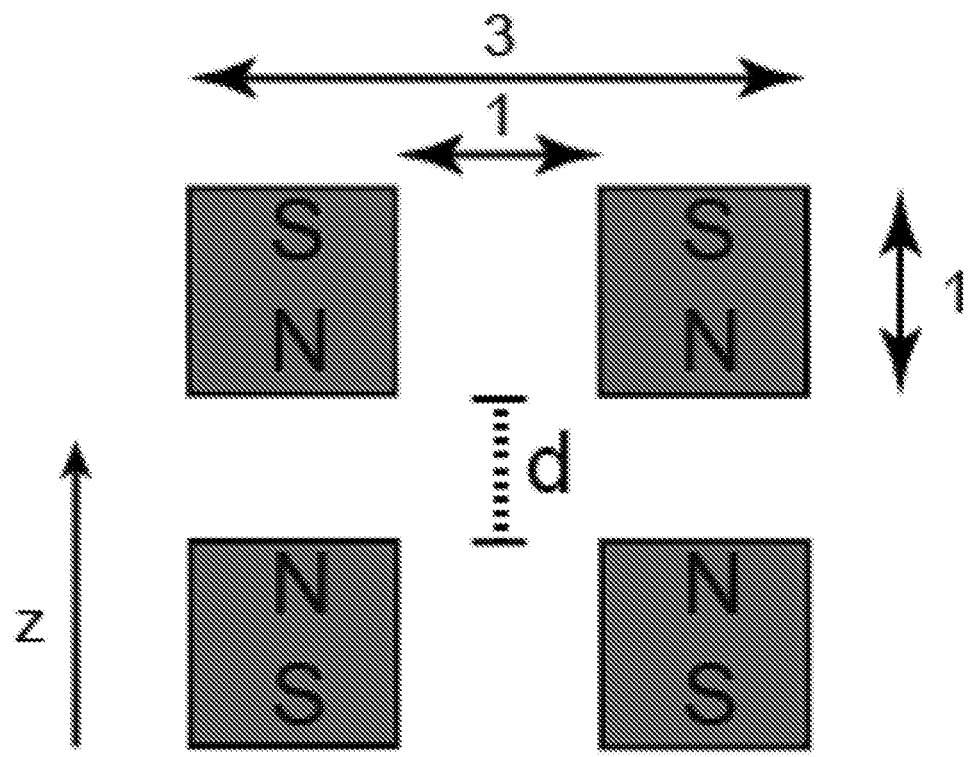
FIG. 6D shows the fine-tuning of the separation distance between the two magnets used in a MagLev device, according to one or more embodiments described herein.
Figure 6E:
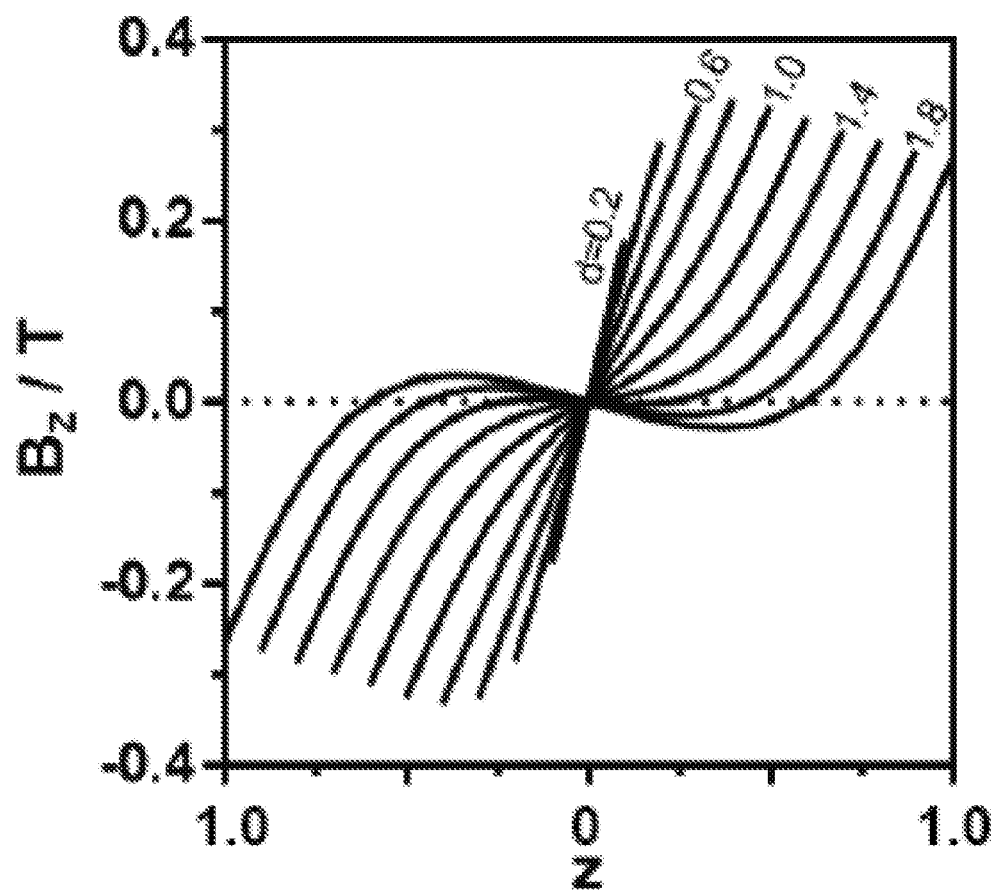
FIG. 6E shows the field strength, $B_z$, along the central axis between the two magnets as the distance of separation is varied, according to one or more embodiments described herein.
Figure 6F:
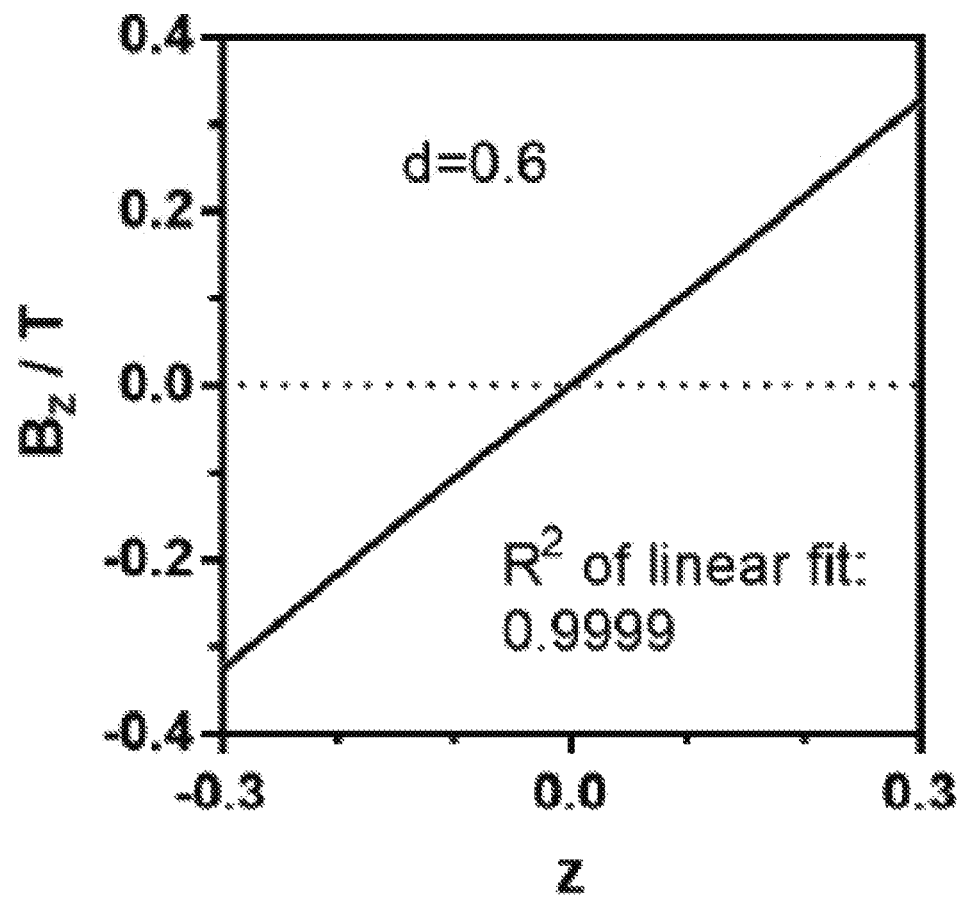
FIG. 6F shows a plot of the curve at d=0.6 in FIG. 6E, according to one or more embodiments described herein.

FIGS. 6A-F show the selection of the geometry and the distance of separation between the ring magnets using Comsol® simulation, according to one or more embodiments. FIG. 6A is a schematic showing the four independent physical parameters used to define the configuration of the setup (od: out diameter, id: inner diameter, h: height of the magnet, d: distance of separation), according to one or more embodiments. Combinations of the parameters explored using Comsol® simulation in these embodiments are given in Table 2. FIG. 6B shows a specific example of a linear gradient with a max field strength of ~0.4 T along the central axis between the magnets (dotted line in the inset), according to one or more embodiments. FIG. 6C shows a non-linear gradient with a max field strength of ~0.5 T along the central axis between the magnets (dotted line in the inset), according to one or more embodiments. FIG. 6D shows fine-tuning of the separation distance between the two magnets (od: 3, id: 1, h: 1), according to one or more embodiments. FIG. 6E shows the field strength, Bz, along the central axis between the two magnets as the distance of separation was varied from 0.2 to 2 at a step of 0.2, according to one or more embodiments. FIG. 6F shows replot of the curve at d=0.6 in FIG. 6E. In some embodiments, the aspect ratios of these parameters (d=1) were focused to optimize the magnetic field profile, and thus, the parameters are all unitless.

Density is a universal property of all matter, and a simple, inexpensive, and useful MagLev device, such as the axial MagLev device described herein, may expand the utility of MagLev-based density analysis in chemistry, biochemistry, and materials science. In some embodiments, the compact design, portability, affordability, and simplicity of use of the axial MagLev device may enable characterization of materials (e.g., the swelling behavior of crosslinked polymeric materials in solvents), separations of samples (particularly small quantities, such as, e.g., crystals), and in manipulating samples (e.g., hard, soft, and sticky objects, such as, e.g., gels) without physical contact.

TABLE 2

Parameters examined using Comsol ® simulations.

| Parameter | Range | Description |
|---|---|---|
| d | 1 | Distance of separation of the two magnets |
| id | 0.25, 0.5, 1, 2, 4 | Inner diameter of the ring magnet |
| $k_{od}$ | 0.5, 1, 2, 4, 8, 16 | Parameter to define the outer diameter of the ring magnet (od = id × (1 + $k_{od}$)) |
| h | 0.25, 0.5, 1, 2, 4 | Height of the ring magnet |

Materials

In some embodiments, polyamide-imides (Torlon®) and polytetrafluoroethylene (Teflon®) were obtained from McMaster-Carr. In some embodiments, aluminum foil was obtained from Sigma-Aldrich. In some embodiments, zirconium silicate was obtained from Cospheric LLC. In some embodiments, the density of air was obtained from the CRC Handbook of Chemistry and Physics, 98th Edition.

Correlation of Swelling Ratio and Densities

In some embodiments, Equation S1 gives the density of a crosslinked polymeric sample in the dry state, Equation S2 gives the density in the swollen state, and Equation S3 gives the swelling ratio of the sample:

$$\rho_p = \frac{m_p}{V_p} \tag{S1}$$

$$\rho_{sp} = \frac{m_p + m_s}{V_{sp}} \tag{S2}$$

$$f = \frac{V_{sp}}{V_p} \tag{S3}$$

In Equations S1-3, $m_p$ is the mass of the sample, $m_s$ is the mass of the solvent present in the swollen sample, $V_{sp}$ is the volume of the swollen sample, $V_p$ is the volume of the dry sample, $\rho_p$ is the density of the sample, $\rho_{sp}$ is the density of the swollen sample, and $\rho_s$ is the density of the solvent.

In some embodiments, for a swollen sample, the mass of the solvent is described by Equation S4:

$$m_s = \rho_s(V_{sp} - V_p) \tag{S4}$$

In some embodiments, solving Equations S1-S4 gives Equation S5, which describes the relationship between the swelling ratio and the densities.

$$f = \frac{\rho_p - \rho_s}{\rho_{sp} - \rho_s} \tag{S5}$$

It will be appreciated that while one or more particular materials or steps have been shown and described for purposes of explanation, the materials or steps may be varied in certain respects, or materials or steps may be combined, while still obtaining the desired outcome. Additionally, modifications to the disclosed embodiment and the invention as claimed are possible and within the scope of this disclosed invention.

The invention claimed is:

1. A magnetic levitation system comprising:
   a first cylinder-shaped magnet;
   a second cylinder-shaped magnet coaxially aligned with the first cylinder-shaped magnet;
   a first cavity coaxially aligned with and formed in the first cylinder-shaped magnet; and
   a container configured to hold a paramagnetic solution;
   wherein the surfaces of like polarity of the first and second cylinder-shaped magnets are parallel to each other and face each other to result in a linear, axially symmetric magnetic field between the first and the second magnets; and
   wherein the container is at least partially disposed between the first and second cylinder-shaped magnets.

2. The system of claim 1, wherein the first cavity is cylinder-shaped.

3. The system of claim 1, wherein the first cavity spans through the entire height of the first cylinder-shaped magnet.

4. The system of claim 1, wherein the linear, axially symmetric magnetic field extends into the first cavity.

5. The system of claim 1, wherein the first and second cylinder-shaped magnets have a different radius or height.

6. The system of claim 1, wherein the first and second cylinder-shaped magnets have the same radius, height or both.

7. The system of claim 1, wherein the system further comprises a second cavity formed in and coaxially aligned with the second cylinder-shaped magnet.

8. The system of claim 7, wherein the second cavity is cylinder-shaped.

9. The system of claim 1, wherein the distance between the surfaces of like polarity of the first and second cylinder-shaped magnets is d and the heights of the first and second cylinder-shaped magnets are $h_1$ and $h_2$, respectively; and the ratio of at least one of $h_1$ and $h_2$ to d is from about 0.2:1 to about 10:1.

10. The system of claim 9, wherein the ratio of at least one of $h_1$ and $h_2$ to d is about 1.67:1.

11. The system of claim 9, wherein
the first cylinder-shaped magnet's inner diameter is $id_1$; and
the ratio of $id_1$ to d is from about 0.2:1 to about 10:1.

12. The system of claim 11, wherein the ratio of $id_1$ to d is about 1.67:1.

13. The system of claim 9, wherein
the first cylinder-shaped magnet's outer diameter is $od_1$; and
the ratio of $od_1$ to d is from about 0.3:1 to about 100:1.

14. The system of claim 13, wherein the ratio of $od_1$ to d is about 5:1.

15. The system of claim 9, wherein
the system further comprises a second cylinder-shaped cavity formed in and coaxially aligned with the second cylinder-shaped magnet;
the second cylinder-shaped magnet's inner diameter is $id_2$; and
the ratio of $id_2$ to d is from about 0.2:1 to about 10:1.

16. The system of claim 15, wherein the ratio of $id_2$ to d is about 1.67:1.

17. The system of claim 9, wherein
the system further comprises a second cavity formed in and coaxially aligned with the second cylinder-shaped magnet;
the second cylinder-shaped magnet's outer diameter is $od_2$; and
the ratio of $od_2$ to d is from about 0.3:1 to about 100:1.

18. The system of claim 17, wherein the ratio of $od_2$ to d is about 5:1.

19. The system of claim 1, wherein the first cavity is cylinder-shaped and the relationship of the first cylinder-shaped magnet's inner diameter ($id_1$):outer diameter ($od_1$): height ($h_1$):distance between the surfaces of like polarity of the first and second cylinder-shaped magnets (d) is about 1.67:5:1.67:1.

20. The system of claim 1, wherein
the system further comprises a second cylinder-shaped cavity formed in and coaxially aligned with the second cylinder-shaped magnet; and
the relationship of the second cylinder-shaped magnet's inner diameter ($id_2$):outer diameter ($od_2$):height ($h_2$): distance between the surfaces of like polarity of the first and second cylinder-shaped magnets (d) is about 1.67: 5:1.67:1.

21. The system of claim 1, wherein the container further comprises an inlet configured to allow adding or removing the paramagnetic solution or a paramagnetic or diamagnetic sample.

22. The system of claim 1, wherein the container comprises two ends, at least one of which extends into or through the first cavity.

23. The system of claim 22, wherein
the system further comprises a second cavity formed in and coaxially aligned with the second cylinder-shaped magnet; and
the other end of the container's two ends extends into or through the second cylinder-shaped cavity.

24. The system of claim 1, wherein the container is a cuvette.

25. The system of claim 1, wherein the paramagnetic solution comprises an aqueous solution of a paramagnetic compound.

26. The system of claim 25, wherein the paramagnetic compound is selected from the group consisting of $MnCl_2$, $MnBr_2$, $CuSO_4$, $GdCl_3$, $DyCl_3$, $HoCl_3$, a Gd chelated compound, and a combination thereof.

27. The system of claim 26, wherein the Gd chelated compound is gadolinium (III) diethylenetriaminepentaacetic acid.

28. The system of claim 1, wherein the paramagnetic solution comprises a $MnCl_2$ aqueous solution.

29. The system of claim 1, wherein the paramagnetic solution comprises a hydrophobic paramagnetic solution or a paramagnetic ionic liquid.

30. The system of claim 1, wherein the maximal magnetic field along the common axis of the first and second cylinder-shaped magnets is from about 0.20 T to about 0.05 T.

31. The system of claim 1, wherein the first and second cylinder-shaped magnets are NdFeB magnets.

32. The system of claim 1, wherein the system optionally comprises a second cylinder-shaped cavity spanning through the entire height of the second cylinder-shaped magnet and coaxially aligned with the second cylinder-shaped magnet; and the first or second cylinder-shaped magnet's inner diameter is from about 15 mm to about 40 mm.

33. The system of claim 32, wherein the first or second cylinder-shaped magnet's inner diameter is about 25 mm.

34. The system of claim 1, wherein the system optionally comprises a second cylinder-shaped cavity spanning through the entire height of the second cylinder-shaped magnet and coaxially aligned with the second cylinder-shaped magnet; and the first or second cylinder-shaped magnet's outer diameter is from about 50 mm to about 100 mm.

35. The system of claim 34, wherein the first or second cylinder-shaped magnet's outer diameter is about 76 mm.

36. The system of claim 1, wherein the first or second cylinder-shaped magnet's height is from about 15 mm to about 50 mm.

37. The system of claim 36, wherein the first or second cylinder-shaped magnet's height is about 25 mm.

38. The system of claim 1, wherein the distance between the surfaces of like polarity of the first and second cylinder-shaped magnets is from about 5 mm to about 50 mm.

39. The system of claim 38, wherein the distance between the surfaces of like polarity of the first and second cylinder-shaped magnets is about 15 mm.

40. A method of analyzing a diamagnetic or paramagnetic sample, comprising:
- providing the system of claim 1;
- adding a paramagnetic solution and a diamagnetic or paramagnetic sample, either separately or together, into the container; and
- allowing the diamagnetic or paramagnetic sample to levitate under the linear, axially symmetric magnetic field between the first and second cylinder-shaped magnets.

41. The method of claim 40, wherein the paramagnetic solution or the diamagnetic or paramagnetic sample is added through the first cylinder-shaped cavity.

42. The method of claim 40, further comprising removing the paramagnetic solution or the diamagnetic or paramagnetic sample.

43. The method of claim 42, wherein the paramagnetic solution or the diamagnetic or paramagnetic sample is removed through the first cylinder-shaped cavity.

44. The method of claim 40, wherein the paramagnetic solution comprises an aqueous solution of a paramagnetic compound, a hydrophobic paramagnetic solution, or a paramagnetic ionic liquid.

45. The method of claim 44, wherein the paramagnetic compound is selected from the group consisting of $MnCl_2$, $MnBr_2$, $CuSO_4$, $GdCl_3$, $DyCl_3$, $HoCl_3$, a Gd chelated compound, and a combination thereof.

46. The method of claim 45, wherein the Gd chelated compound is gadolinium (III) diethylenetriaminepentaacetic acid.

47. The method of claim 40, wherein the paramagnetic solution comprises a $MnCl_2$ aqueous solution.

48. The method of claim 40, wherein the paramagnetic solution further comprises cetyltrimethylammonium bromide.

49. The method of claim 40, wherein the diamagnetic or paramagnetic sample comprises a crosslinked polymer.

50. The method of claim 49, further comprising determining the density of the crosslinked polymer.

51. The method of claim 50, further comprising generating a standard curve correlating a sample's levitation height in the system with its density and determining the density of the crosslinked polymer using the standard curve and its levitation height in the system.

52. The method of claim 49, wherein the crosslinked polymer comprises polydimethylsiloxane.

* * * * *